(12) United States Patent
Yu et al.

(10) Patent No.: US 11,855,246 B2
(45) Date of Patent: Dec. 26, 2023

(54) SEMICONDUCTOR DEVICE AND METHOD

(71) Applicant: Taiwan Semiconductor Manufacturing Company, Ltd., Hsinchu (TW)

(72) Inventors: Chen-Hua Yu, Hsinchu (TW); Keng-Han Lin, Hsinchu (TW); Hung-Jui Kuo, Hsinchu (TW); Hui-Jung Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/509,262

(22) Filed: Oct. 25, 2021

(65) Prior Publication Data

US 2022/0045254 A1 Feb. 10, 2022

Related U.S. Application Data

(62) Division of application No. 16/158,604, filed on Oct. 12, 2018, now Pat. No. 11,158,775.

(Continued)

(51) Int. Cl.
*H01L 23/522* (2006.01)
*H01L 33/62* (2010.01)
(Continued)

(52) U.S. Cl.
CPC .......... *H01L 33/62* (2013.01); *H01L 23/5226* (2013.01); *H01L 25/0753* (2013.01);
(Continued)

(58) Field of Classification Search
CPC ........... H01L 24/11–13; H01L 23/5226; H01L 21/76837; H01L 21/311; H01L 33/62
See application file for complete search history.

(56) References Cited

U.S. PATENT DOCUMENTS

| 4,738,937 A | 4/1988 | Parsons |
| 6,048,762 A * | 4/2000 | Hsia ................. H01L 27/10852 257/E21.162 |

(Continued)

FOREIGN PATENT DOCUMENTS

| CN | 1971877 A | 5/2007 |
| CN | 104054171 A | 9/2014 |

(Continued)

OTHER PUBLICATIONS

"The Authoritative Dictionary of IEEE StandardTerms," 7th Edition, Dec. 11, 2000, p. 112.

*Primary Examiner* — Eric K Ashbahian
(74) *Attorney, Agent, or Firm* — Slater Matsil, LLP

(57) ABSTRACT

In an embodiment, a device includes: an interconnect structure including a first contact pad, a second contact pad, and an alignment mark; a light emitting diode including a cathode and an anode, the cathode connected to the first contact pad; an encapsulant encapsulating the light emitting diode; a first conductive via extending through the encapsulant, the first conductive via including a first seed layer, the first seed layer contacting the second contact pad; a second conductive via extending through the encapsulant, the second conductive via including a second seed layer, the first seed layer and the second seed layer including a first metal; and a hardmask layer between the second seed layer and the alignment mark, the hardmask layer including a second metal, the second metal different from the first metal.

20 Claims, 22 Drawing Sheets

Related U.S. Application Data

(60) Provisional application No. 62/682,469, filed on Jun. 8, 2018.

(51) Int. Cl.
*H01L 25/075* (2006.01)
*H01L 33/10* (2010.01)
*H01L 33/46* (2010.01)
*H01L 33/52* (2010.01)
*H01S 5/022* (2021.01)

(52) U.S. Cl.
CPC .......... *H01L 33/105* (2013.01); *H01L 33/465* (2013.01); *H01L 33/52* (2013.01); *H01L 2933/005* (2013.01); *H01L 2933/0025* (2013.01); *H01L 2933/0033* (2013.01); *H01S 5/022* (2013.01)

(56) References Cited

U.S. PATENT DOCUMENTS

| | | | |
|---|---|---|---|
| 6,184,066 B1 | 2/2001 | Chino et al. |
| 6,614,058 B2 | 9/2003 | Lin et al. |
| 6,642,079 B1 | 11/2003 | Liu et al. |
| 6,661,823 B1 | 12/2003 | Otoma et al. |
| 7,172,945 B2 | 2/2007 | Shioga et al. |
| 7,538,375 B2 | 5/2009 | Kim et al. |
| 7,808,030 B2 | 10/2010 | Mizuno et al. |
| 7,936,568 B2 | 5/2011 | Mashino |
| 8,690,397 B2 | 4/2014 | Muraguchi |
| 9,355,936 B2 | 5/2016 | Cooney, III et al. |
| 9,666,522 B2 | 5/2017 | Huang et al. |
| 9,859,218 B1 | 1/2018 | Patlolla et al. |
| 10,262,952 B2 | 4/2019 | Chen et al. |
| 10,321,577 B2 | 6/2019 | Shang et al. |
| 10,497,796 B1 | 12/2019 | Cheng et al. |
| 2001/0006528 A1 | 7/2001 | Sato et al. |
| 2002/0086520 A1 | 7/2002 | Chiang |
| 2003/0136997 A1 | 7/2003 | Shioga et al. |
| 2004/0062283 A1* | 4/2004 | Takeuchi ............ H01S 5/32341 372/45.01 |
| 2004/0092055 A1 | 5/2004 | Liu |
| 2005/0095781 A1 | 5/2005 | Papa Rao et al. |
| 2007/0105265 A1 | 5/2007 | Lai et al. |
| 2007/0222030 A1 | 9/2007 | Salama et al. |
| 2007/0235790 A1 | 10/2007 | Kim et al. |
| 2008/0031295 A1 | 2/2008 | Tanaka |
| 2008/0291649 A1 | 11/2008 | Mashino |
| 2009/0020777 A1 | 1/2009 | Wata et al. |
| 2009/0175307 A1 | 7/2009 | Ryu et al. |
| 2010/0025817 A1 | 2/2010 | Mihara |
| 2010/0051978 A1 | 3/2010 | Katsuno et al. |
| 2010/0215070 A1 | 8/2010 | Hattori |
| 2010/0295149 A1 | 11/2010 | Summerfelt et al. |
| 2011/0211604 A1 | 9/2011 | Roscher |
| 2011/0306214 A1 | 12/2011 | Zin |
| 2012/0025370 A1 | 2/2012 | Wholey et al. |
| 2012/0104450 A1* | 5/2012 | Chen ....................... H01L 24/24 257/E33.064 |
| 2012/0142177 A1 | 6/2012 | Kim et al. |
| 2012/0181562 A1 | 7/2012 | Lee et al. |
| 2012/0266810 A1 | 10/2012 | Lan et al. |
| 2013/0241080 A1 | 9/2013 | Pagaila |
| 2014/0048951 A1 | 2/2014 | Lin et al. |
| 2014/0131858 A1 | 5/2014 | Pan et al. |
| 2014/0209908 A1 | 7/2014 | Cooney, III et al. |
| 2014/0217604 A1 | 8/2014 | Chou et al. |
| 2015/0108635 A1 | 4/2015 | Liang et al. |
| 2015/0187991 A1 | 7/2015 | McGroddy et al. |
| 2015/0214128 A1 | 7/2015 | Lin et al. |
| 2015/0228538 A1 | 8/2015 | Wada et al. |
| 2015/0279776 A1 | 10/2015 | Hu et al. |
| 2015/0357320 A1 | 12/2015 | Yu et al. |
| 2016/0141219 A1 | 5/2016 | Liu |
| 2016/0163578 A1 | 6/2016 | Yu et al. |
| 2016/0268231 A1 | 9/2016 | Karhade et al. |
| 2016/0308089 A1 | 10/2016 | Kim et al. |
| 2017/0033026 A1 | 2/2017 | Ho et al. |
| 2017/0133549 A1 | 5/2017 | Xu et al. |
| 2017/0162746 A1 | 6/2017 | Cha et al. |
| 2017/0229358 A1* | 8/2017 | Cooney, III .......... H01L 23/544 |
| 2017/0250205 A1 | 8/2017 | Yamazaki |
| 2017/0330767 A1* | 11/2017 | Kang .................. H01L 21/4857 |
| 2018/0061697 A1 | 3/2018 | Yamada |
| 2018/0114938 A1* | 4/2018 | Yasukawa ........... H01L 51/5016 |
| 2018/0130707 A1* | 5/2018 | Clendenning ..... H01L 21/76865 |
| 2018/0151589 A1 | 5/2018 | Shimizu et al. |
| 2018/0158712 A1 | 6/2018 | Ekkels et al. |
| 2018/0211912 A1 | 7/2018 | Yu et al. |
| 2019/0097392 A1 | 3/2019 | Cao et al. |
| 2019/0139888 A1 | 5/2019 | Yu et al. |
| 2019/0252312 A1 | 8/2019 | Yu et al. |
| 2019/0273018 A1 | 9/2019 | Yu et al. |
| 2019/0371777 A1* | 12/2019 | Iguchi .................. H01L 27/124 |
| 2020/0006271 A1 | 1/2020 | Chen et al. |
| 2020/0014169 A1 | 1/2020 | Yu et al. |
| 2020/0219956 A1 | 7/2020 | Aoki et al. |
| 2020/0243442 A1 | 7/2020 | Yu et al. |
| 2020/0251380 A1 | 8/2020 | Yu et al. |

FOREIGN PATENT DOCUMENTS

| | | |
|---|---|---|
| CN | 104401934 A | 3/2015 |
| JP | H09223848 A | 8/1997 |
| JP | 2003197463 A | 7/2003 |
| JP | 2008042118 A | 2/2008 |
| KR | 100729360 B1 | 6/2007 |
| KR | 20120121951 A | 11/2012 |
| KR | 20150012950 A | 2/2015 |
| KR | 20150137967 A | 12/2015 |
| KR | 20160083035 A | 7/2016 |
| KR | 20160124375 A | 10/2016 |
| KR | 20170015260 A | 2/2017 |
| KR | 20170064775 A | 6/2017 |

* cited by examiner

SEMICONDUCTOR DEVICE AND METHOD

PRIORITY CLAIM

This application is a division of U.S. patent application Ser. No. 16/158,604, filed on Oct. 12, 2018, entitled "Semiconductor Device and Method," which claims the benefit of U.S. Provisional Patent Application No. 62/682,469, filed on Jun. 8, 2018, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. Optical features have been integrated with semiconductor devices in increasingly more applications in recent years, particularly due to the rising demand for cameras in phones, tables, and other portable devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
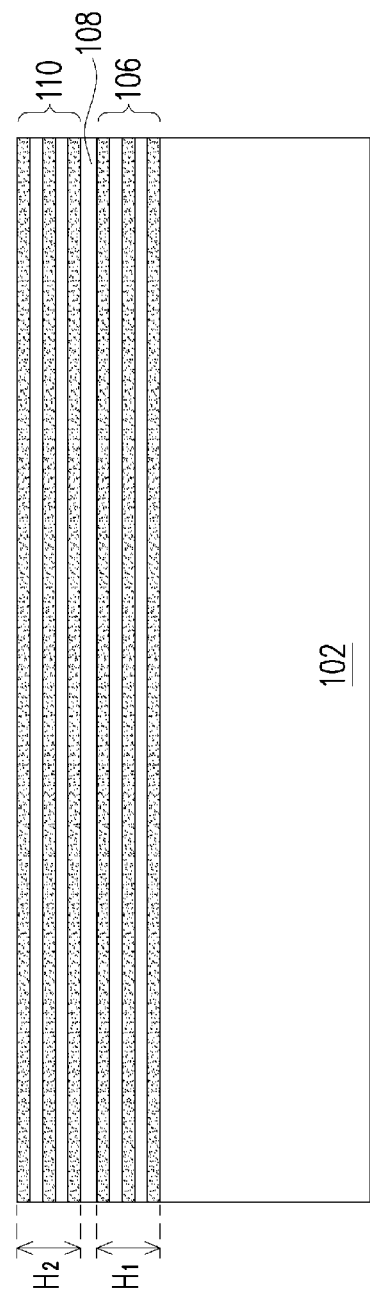
FIGS. 1 through 18 illustrate various cross-sectional view of a process for forming a laser device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, conductive vias are formed between a plurality of light emitting diodes. A top structure is attached to a bottom structure. The bottom structure may comprise, e.g., an interconnect structure, and includes conductive connectors formed thereon. The top structure comprises a substrate having a plurality of light emitting diodes formed thereon, e.g., in a grid pattern. Respective light emitting diodes of the top structure are connected to respective conductive connectors of the bottom structure. The carrier of the top structure is removed by, e.g., an etching process. A photosensitive encapsulant, such as a low temperature polyimide (LTPI), is formed around and on the light emitting diodes. Openings are formed in the photosensitive encapsulant by an etching process, exposing underlying connecting pads of the bottom structure. Forming the openings with an etching process instead of by developing the photosensitive encapsulant may allow openings with a finer pitch to be formed. Conductive vias are then formed in the opening, connected to the underlying connecting pads of the bottom structure. Conductive lines may then be formed connecting the conductive vias to the light emitting diodes. By forming the conductive vias after the light emitting diodes are attached, the chances of collapsed conductive vias may be reduced, and the conductive vias may be formed to a finer pitch with a higher aspect ratio.

Figure 2:
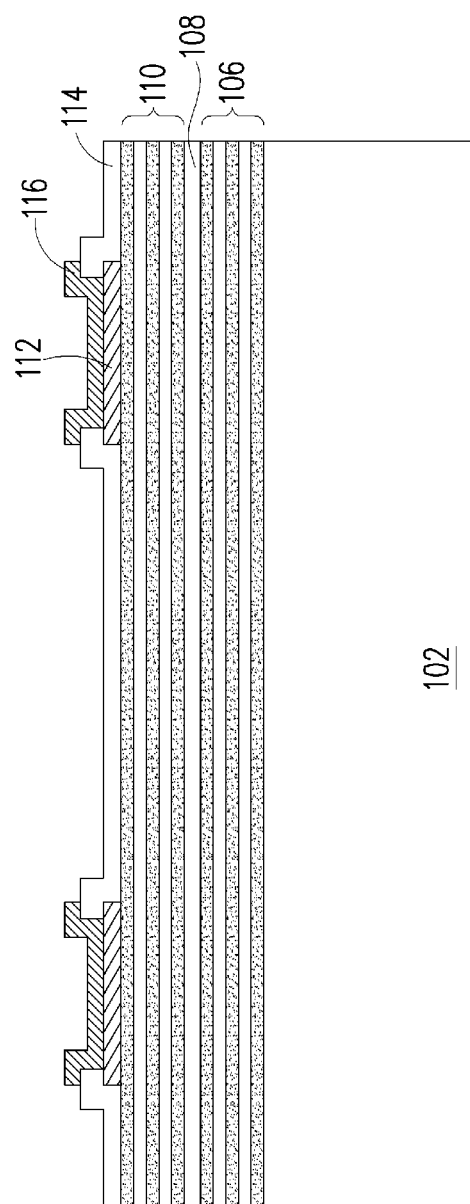
Figure 3:
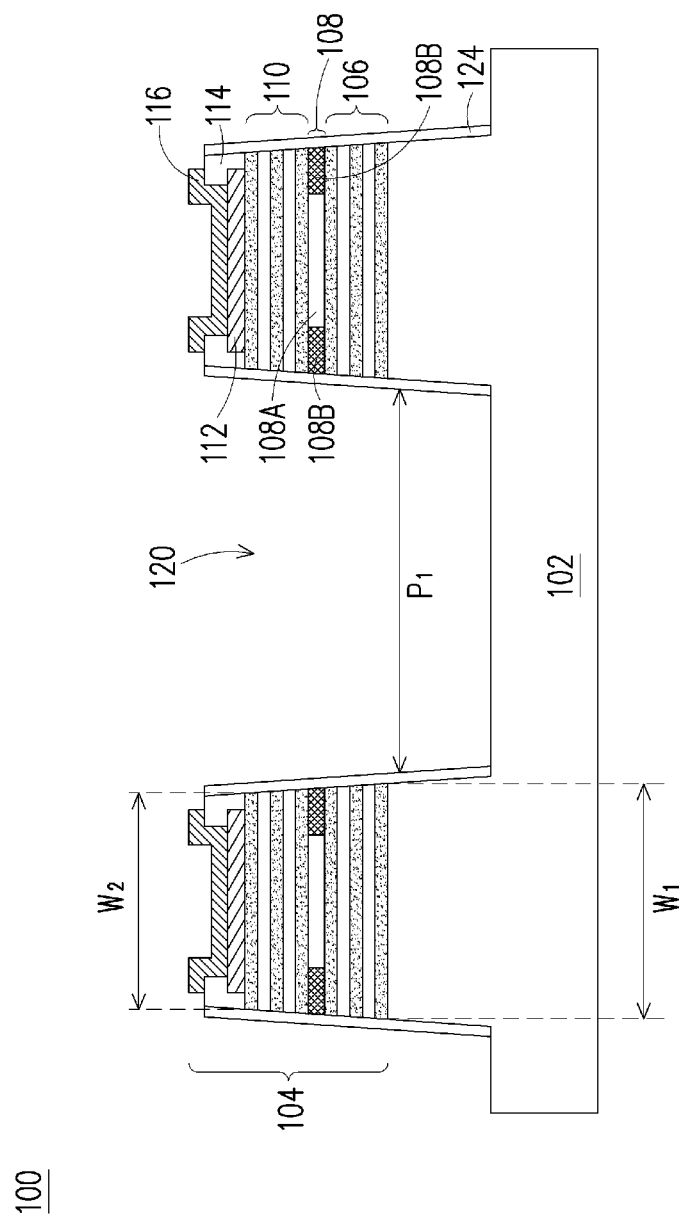

FIGS. 1 through 3 illustrate various cross-sectional view of a process for forming a first structure 100, in accordance with some embodiments. The first structure 100 includes a carrier substrate 102 having a plurality of light emitting diodes 104 (see FIG. 3) formed thereon.

In FIG. 1, a carrier substrate 102 is provided. The carrier substrate 102 may be a semiconductor substrate, such as a bulk semiconductor, a semiconductor-on-insulator (SOI) substrate, or the like, which may be doped (e.g., with a p-type or n-type dopant) or undoped. The carrier substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the carrier substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In a particular embodiment, the carrier substrate 102 is a GaAs substrate.

Further, a first reflective structure 106 is formed on the carrier substrate 102. The first reflective structure 106 includes multiple layers of materials, such as dielectric or semiconductive materials. The layers may be doped or undoped. The layers may be deposited by a suitable deposition process, such as chemical vapor deposition (CVD), or may be grown by a suitable epitaxy process. The first reflective structure 106 may be a distributed Bragg reflector, which uses alternating layers of materials having different refractive indices to reflect light. In some embodiments, the first reflective structure 106 comprises alternating doped and undoped layers of the material of the carrier substrate 102 (e.g., GaAs), with the doped layers having different refractive indices than the undoped layers. The dopant may be any dopant that allows the doped layers to have different refractive indices than the undoped layers. In some embodiments, the dopant is a p-type dopant such as C. In some embodiments, the doped layers of the first reflective structure 106 have a dopant concentration in the range of from about 1E-17 atoms/cm$^3$ to about 1E-18 atoms/cm$^3$. The first reflective structure 106 may thus form p-type reflecting regions in the resulting light emitting diodes 104 (see FIG. 3). The first reflective structure 106 may have any width. In some embodiments, the first reflective structure 106 has a width of 14 μm.

Further, an emitting semiconductor region 108 is formed on the first reflective structure 106. The emitting semiconductor region 108 also comprises a doped layer of the material of the carrier substrate 102 (e.g., GaAs). The emitting semiconductor junction 108 has a p-type region and an n-type region, and comprises a P-N junction that lases at a single resonant frequency during operation. The p-type region may be doped with p-type dopants such as boron, aluminum, gallium, indium, and the like. The n-type region may be doped with n-type dopants such as phosphorus, arsenic, and the like. In some embodiments, the p-type region is formed over the n-type region. The n-type region of the emitting semiconductor region 108 may be connected to the first reflective structure 106 such that light emits towards the first reflective structure 106.

Further, a second reflective structure 110 is formed on the emitting semiconductor region 108. The p-type region of the emitting semiconductor region 108 may be connected to the second reflective structure 110. The second reflective structure 110 includes multiple layers of materials, such as dielectric or semiconductive materials. The layers may be doped or undoped. The layers may be deposited by a suitable deposition process, such as chemical vapor deposition (CVD), or may be grown by a suitable epitaxy process. The second reflective structure 110 may be a distributed Bragg reflector, which uses alternating layers of materials having different refractive indices to reflect light. In some embodiments, the second reflective structure 110 comprises alternating doped and undoped layers of the material of the carrier substrate 102 (e.g., GaAs), with the doped layers having different refractive indices than the undoped layers. The dopant may be any dopant that allows the doped layers to have different refractive indices than the undoped layers. In some embodiments, the dopant is an n-type dopant such as Si. In some embodiments, the doped layers of the second reflective structure 110 have a dopant concentration in the range of from about 1E-17 atoms/cm$^3$ to about 1E-18 atoms/cm$^3$. The second reflective structure 110 may thus form n-type reflecting regions in the resulting light emitting diodes 104 (see FIG. 3). The dopant of the second reflective structure 110 may be a different dopant than the dopant of the first reflective structure 106. The second reflective structure 110 may have any width. In some embodiments, the second reflective structure 110 has a width of 13 μm.

The reflective structures 106 and 110 form a resonant cavity, to help enhance the intensity of light from the emitting semiconductor region 108. The reflective structures 106 and 110 have different reflectivity, e.g., the refractive indices of the reflective structures 106 and 110 are different. In some embodiments, the first reflective structure 106 is formed to have a lower reflectivity than the second reflective structure 110, to allow emission of a laser beam from the emitting semiconductor region 108. The refractive indices of the reflective structures 106 and 110 may be varied by adjusting the overall height and overall doping amount of the reflective structures 106 and 110. For example, the height $H_1$ of the first reflective structure 106 may be less than the height $H_2$ of the second reflective structure 110. In some embodiments, the height $H_1$ is in the range of from about 2 μm to about 4 μm (such as about 3 μm), and the height $H_2$ is in the range of from about 5 μm to about 7 μm (such as about 6 μm).

In FIG. 2, contact pads 112 are formed on the second reflective structure 110. The contact pads 112 are physically and electrically connected to the second reflective structure 110, which itself is physically and electrically connected to the emitting semiconductor region 108. The contact pads 112 thus connect to the n-type side of the resulting light emitting diodes 104 (see FIG. 3). As an example to form the contact pads 112, a seed layer is formed over the second reflective structure 110. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the contact pads 112. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 112.

Further, a passivation layer 114 is formed on the contact pads 112 and the second reflective structure 110. The passivation layer 114 protects the second reflective structure 110 during subsequent processing. The passivation layer 114 may be formed from an inorganic material, which may be a nitride such as silicon nitride, an oxide such as silicon oxide, or the like, and may be formed by a deposition process such as CVD or the like. The passivation layer 114 may also be formed from a polymer, which may be a photosensitive material such as polybenzoxazole (PBO), polyimide, benzocyclobutene (BCB), or the like, and may be formed by spin coating or the like.

Further, underbump metallurgies (UBMs) 116 are formed on the openings of the passivation layer 114. As an example to form the UBMs 116, the passivation layer 114 is patterned with openings exposing the contact pads 112. The patterning may be by an acceptable process, such as by exposing the passivation layer 114 to light when the passivation layer 114 is a photo-sensitive material or by etching using, for example, an anisotropic etch. If the passivation layer 114 is a photo-sensitive material, the passivation layer 114 can be developed after the exposure. A seed layer is formed over the passivation layer 114 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 116. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 116.

In FIG. 3, recesses 120 are formed extending into the carrier substrate 102. The recesses 120 extend through the passivation layer 114, second reflective structure 110, emitting semiconductor region 108, and first reflective structure 106, with remaining portions of such features between the recesses 120 forming the light emitting diodes 104. The recesses 120 may be formed by an acceptable etching process using, for example, an anisotropic etch.

The light emitting diodes 104 are spaced apart a pitch $P_1$, which is determined by the widths of the recesses 120. In some embodiments, the pitch $P_1$ is in the range of from about 4 μm to about 7 μm. Further, the light emitting diodes 104 are formed with a tapered shape. Lower portions of the first reflective structures 106 have a lower width $W_1$, and upper portions of the second reflective structures 110 have an upper width $W_2$. In some embodiments, the lower width $W_1$ is in the range of from about 13 μm to about 15 μm (such as about 14 μm), and the upper width $W_2$ is in the range of from 12 μm to about 14 μm.

Further, opaque portions 108B are formed in the emitting semiconductor regions 108 of the light emitting diodes 104. The opaque portions 108B extend around the perimeter of transparent portions 108A of the emitting semiconductor regions 108 in a top-down view. The opaque portions 108B substantially block or absorb light from the emitting semiconductor region 108, such that the light is not emitted from the light emitting diodes 104 in lateral direction (e.g., in a direction parallel to a major surface of the carrier substrate 102). The opaque portions 108B comprise oxidized material of the emitting semiconductor regions 108, and may be formed by a oxidation process such as a rapid thermal oxidation (RTO) process, a chemical oxidation process, a rapid thermal anneal (RTA) performed in an oxygen-containing environment, or the like. The remaining transparent portions 108A of the emitting semiconductor regions 108 may be masked by, e.g., a photoresist during the oxidation.

Further, protective spacers 124 are formed on sides of the light emitting diodes 104. The protective spacers 124 may be formed from a dielectric material such as silicon nitride, silicon oxide, SiCN, a combination thereof, or the like. The protective spacers 124 may be formed by a conformal deposition followed by an anisotropic etch.

Figure 4:
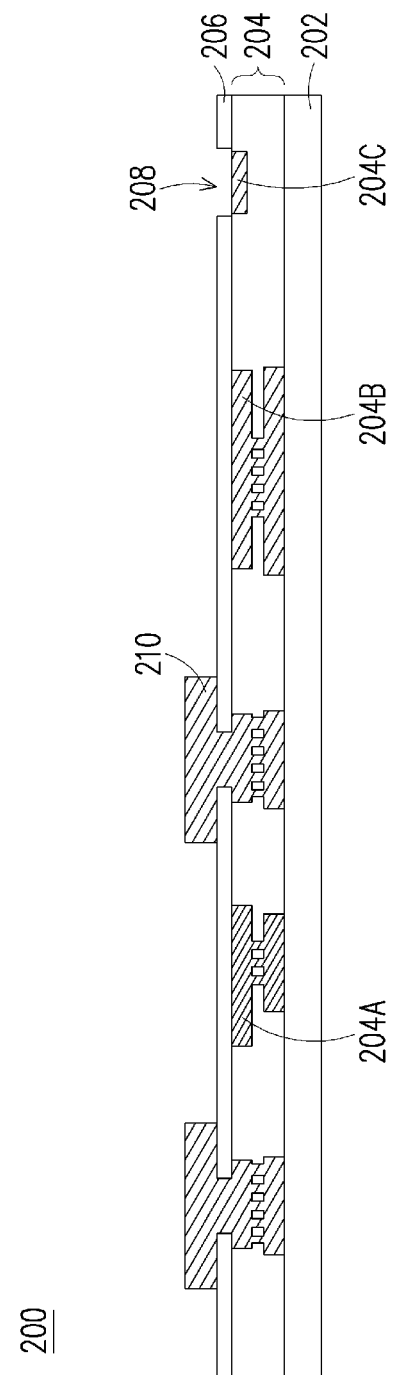

FIG. 4 illustrates a cross-sectional view of a second structure 200, in accordance with some embodiments. The second structure 200 may be a device such as an integrated circuit, an interposer, or the like. The second structure 200 includes a semiconductor substrate 202, with devices such as transistors, diodes, capacitors, resistors, etc., formed in and/or on the semiconductor substrate 202. The devices may be interconnected by an interconnect structure 204 formed by, for example, metallization patterns in one or more dielectric layers on the semiconductor substrate to form an integrated circuit. The interconnect structure 204 includes pads 204A and 204B, which may, respectively, be used for coupling to the light emitting diodes 104 and external connections. The interconnect structure 204 further includes alignment marks 204C. A passivation layer 206 is formed over the interconnect structure 204 to protect the structure. The passivation layer 206 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The passivation layer 206 is patterned with openings 208 exposing the alignment marks 204C. The exposed alignment marks 204C are used for accurate positioning during subsequent processing. The second structure 200 further comprises contact pads 210, such as aluminum or copper pads or pillars, to which external connections are made. The contact pads 210 are on what may be referred to as respective active sides of the second structure 200, and may be formed extending through the passivation layer 206 by, e.g., photolithography, etching, and plating processes.

FIGS. 5 through 18 illustrate various cross-sectional view of a process for forming a laser device 300, in accordance with some embodiments. The laser device 300 may be packaged in further processing to form, e.g., an image sensor, a fiber optic networking device, or the like. The resulting device may be part of an integrated circuit device, such as a system-on-chip (SoC).

Figure 5:
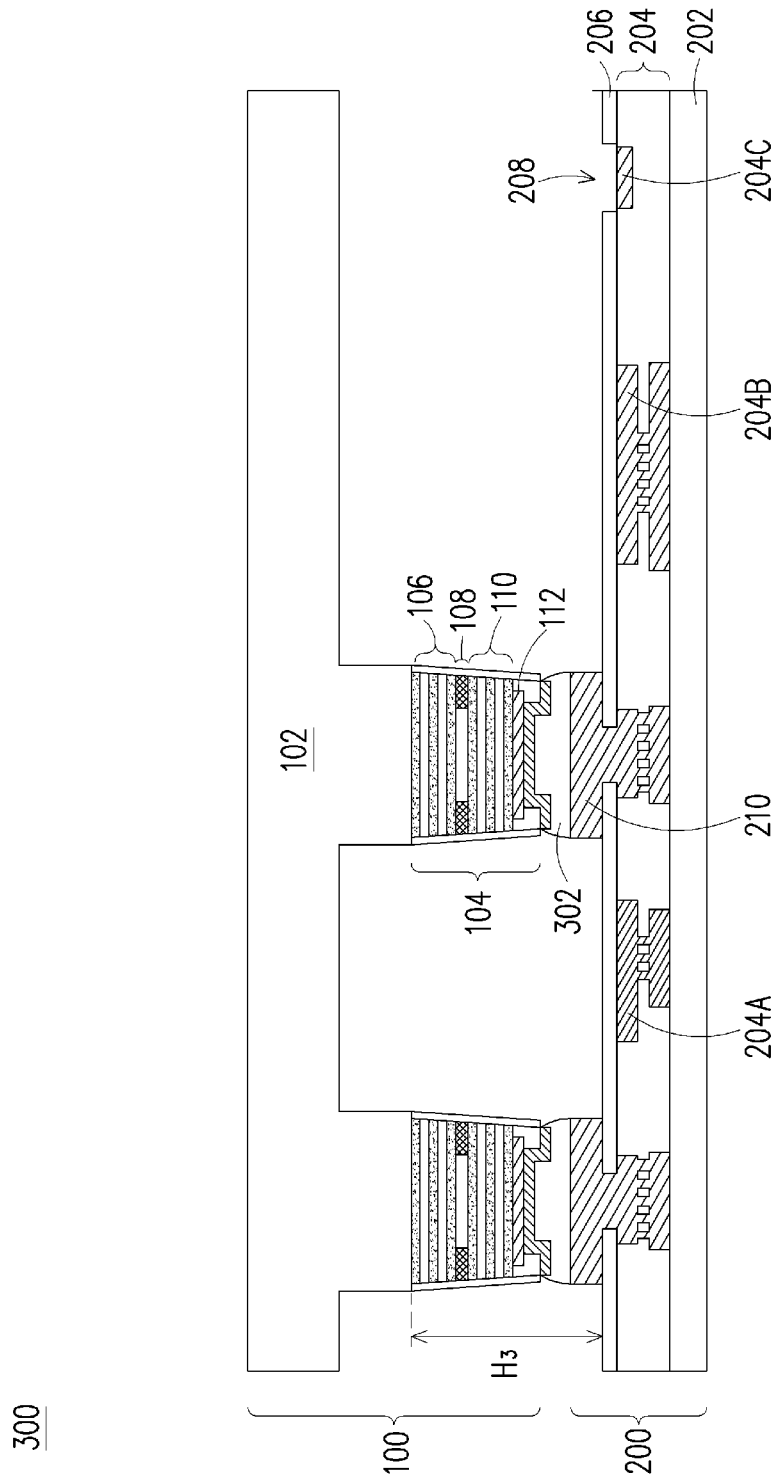

In FIG. 5, the first structure 100 is connected to the second structure 200. The light emitting diodes 104 of the first structure 100 are connected to contact pads 210 of the second structure 200. Conductive connectors 302 may be formed connecting the contact pads 112 of the light emitting diodes 104 with respective ones of the contact pads 210. The conductive connectors 302 may be formed from a conductive material such as solder, copper, aluminum, gold, nickel, silver, palladium, tin, the like, or a combination thereof. In some embodiments, the conductive connectors 302 are solder connections. In some embodiments, the conductive connectors 302 are formed by initially forming a layer of solder on the UBMs 116 or contact pads 210 through such commonly used methods such as evaporation, electroplating, printing, solder transfer, ball placement, or the like. Once a layer of solder has been formed on the UBMs 116 or contact pads 210, the contact pads 210 and UBMs 116 are physically contacted, and a reflow may be performed in order to shape the material into the desired bump shapes. After the light emitting diodes 104 are attached, the light emitting diodes 104, contact pads 210, and conductive connectors 302 have a combined height $H_3$. In some embodiments, the combined height $H_3$ is in the range of from about 13 μm to about 15 μm (such as about 14 μm).

When the first structure 100 is connected to the second structure 200, the second reflective structures 110 (e.g., n-type sides or cathodes) of the light emitting diodes 104 face towards the second structure 200, and the first reflective structures 106 (e.g., p-type sides or anodes) of the light emitting diodes 104 face towards the first structure 100. As noted above, the first reflective structure 106 has a lower reflectivity than the second reflective structure 110. As such, the produced laser beam from the emitting semiconductor region 108 is reflected by the second reflective structures 110. Some of the reflected laser beam is further reflected by the first reflective structure 106, and some is transmitted through the first reflective structure 106.

Figure 6:
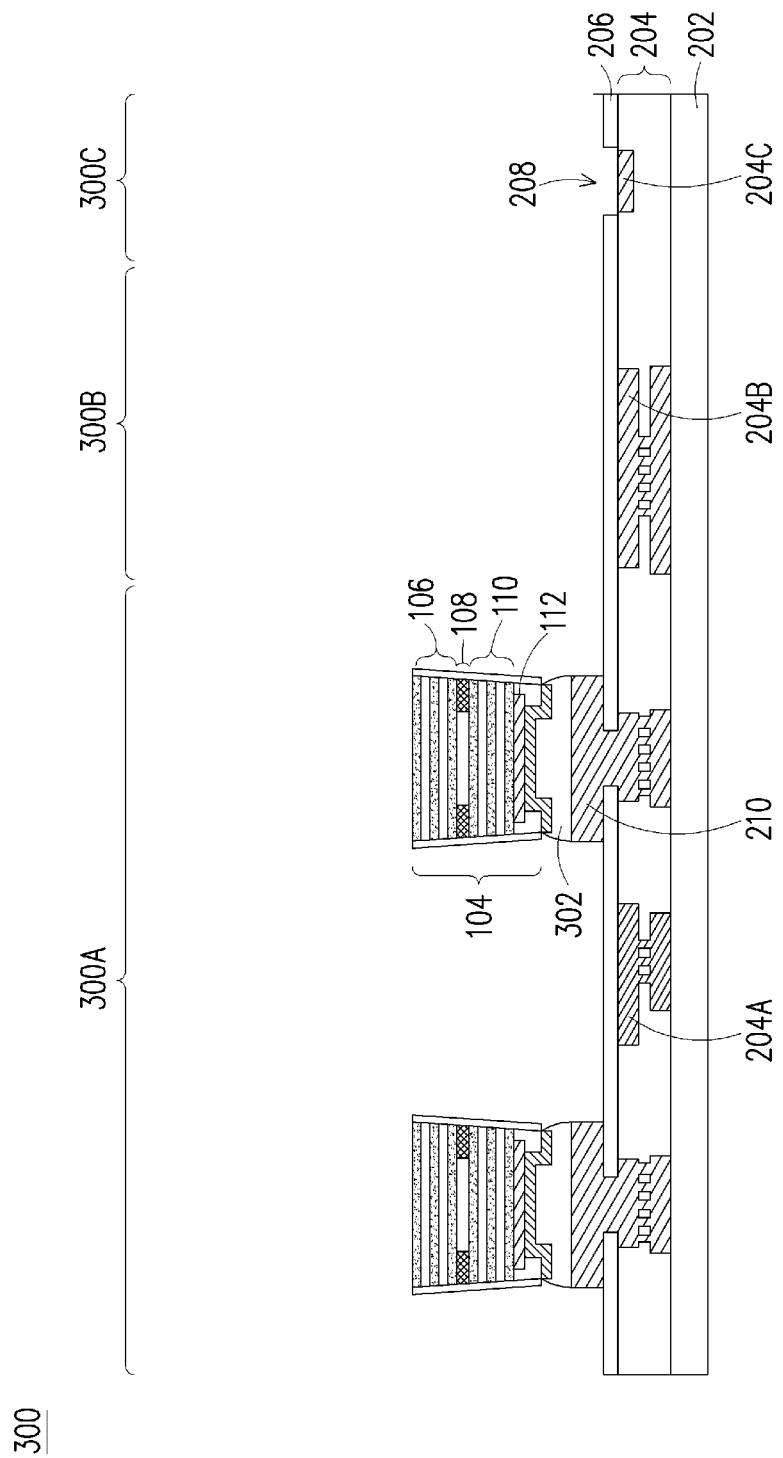

In FIG. 6, the carrier substrate 102 is removed, leaving behind the light emitting diodes 104. The carrier substrate 102 may be removed by an etching process, such as a dry etch that is selective to the material of the carrier substrate 102 (e.g., GaAs). After removal, the light emitting diodes 104 remain in an emitting region 300A of the laser device 300. The laser device 300 further includes a connecting region 300B and an alignment region 300C. As discussed further, conductive vias are formed in each of the regions 300A, 300B, and 300C.

Figure 7:
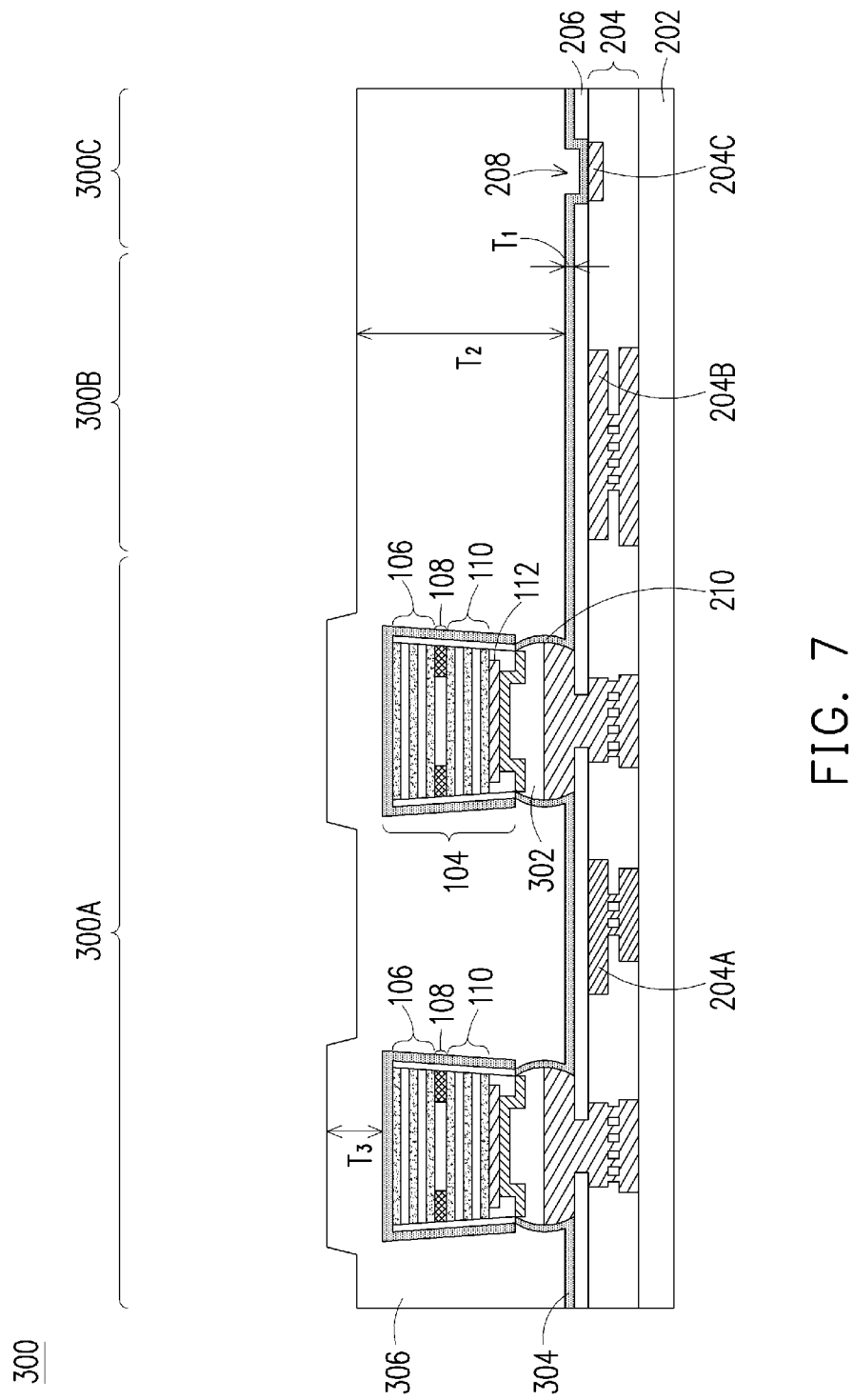

In FIG. 7, a passivation layer 304 is formed over the light emitting diodes 104 and passivation layer 206. The passivation layer 304 also extends along sides of the contact pads 210 and conductive connectors 302, and in the openings 208. The passivation layer 304 may comprise silicon oxide, silicon nitride, or the like, and may be formed by a deposition process such as chemical vapor deposition (CVD). In some embodiments, the passivation layer 304 is formed from an oxide (such as silicon oxide). The passivation layer 304 is formed to a thickness $T_1$. In some embodiments, the thickness $T_1$ is in the range of from about 0.05 µm to about 0.1 µm.

Further, a photosensitive encapsulant 306 is formed over the passivation layer 304. The photosensitive encapsulant may be formed from, e.g., an LTPI, and may be formed by a coating process such as spin coating. An LTPI may allow for better gap filling than an oxide and may help avoid the formation of voids. The photosensitive encapsulant 306 is formed to a thickness $T_2$, which is greater than the thickness $T_1$ of the passivation layer 304. In some embodiments, the thickness $T_2$ is in the range of from about 14 µm to about 16 µm. The photosensitive encapsulant 306 surrounds and buries the light emitting diodes 104. Portions of the photosensitive encapsulant 306 over the light emitting diodes 104 have a thickness $T_3$. In some embodiments, the thickness $T_3$ is in the range of from about 2 µm to about 3 µm.

Figure 8:
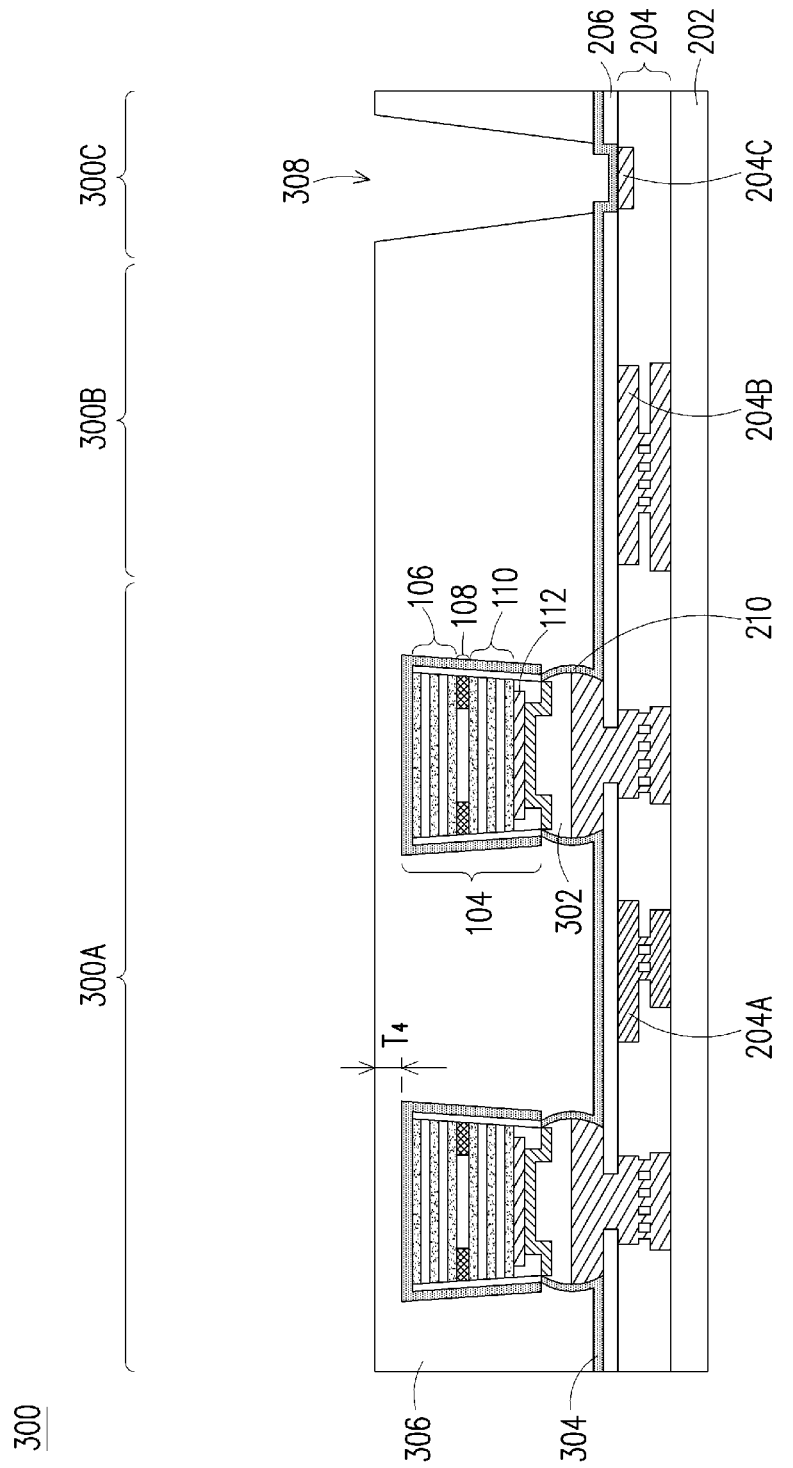

In FIG. 8, a planarization process is performed to planarize and thin the photosensitive encapsulant 306. In particular, the amount of photosensitive encapsulant 306 over the light emitting diodes 104 is reduced. The planarization process may be, e.g., a grinding process, a chemical-mechanical polish (CMP) process, or the like. After planarization and thinning, portions of the photosensitive encapsulant 306 over the light emitting diodes 104 have a reduced thickness $T_4$, which is less than the thickness $T_3$. In some embodiments, the reduced thickness $T_4$ is in the range of from about 1 µm to about 2 µm (such as about 1 µm).

Further, openings 308 are formed in the alignment region 300C, over the alignment marks 204C. The openings 308 may be formed by a lithography process. For example, the photosensitive encapsulant 306 may be exposed to light for patterning, and developed to form the openings 308. In some embodiments, the openings 308 expose portions of the passivation layer 304 over the alignment marks 204C. In some embodiments, the openings 308 extend through the passivation layer 304 to expose the alignment marks 204C.

Figure 9:
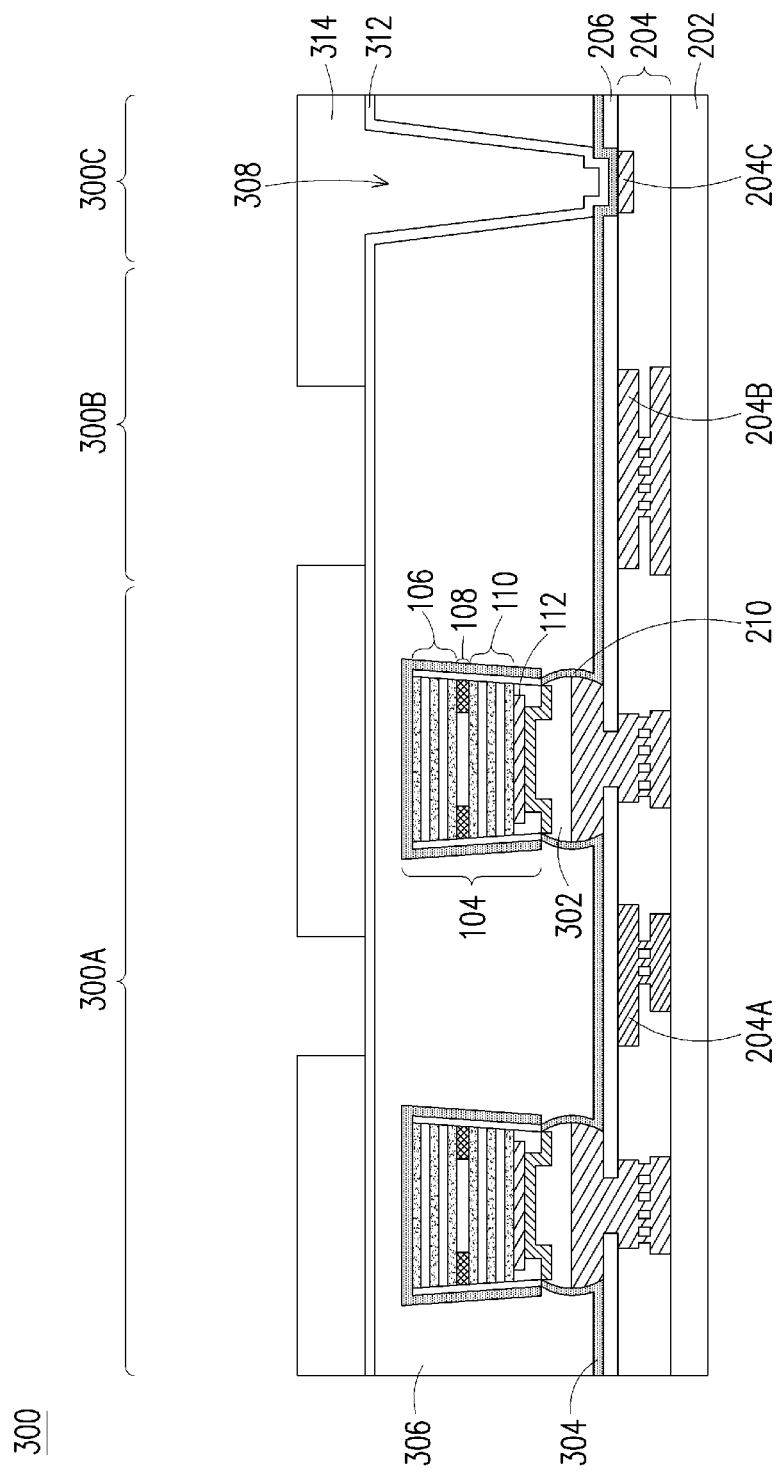

In FIG. 9, a mask layer 312 is formed on the photosensitive encapsulant 306. The mask layer 312 may be formed from a metal or a metal-containing material such as Ti, Cu, TiW, TaN, TiN, combinations thereof, or multilayers thereof, and may be referred to as a hardmask layer. The mask layer 312 may be formed by a deposition process such as physical vapor deposition (PVD), CVD, or the like. The mask layer 312 may also extend into the openings 308.

Further, a photoresist 314 is formed on the mask layer 312. The photoresist 314 may be a single-layer photoresist, a tri-layer photoresist, or the like, and is formed directly on (e.g., contacting) the mask layer 312. The photoresist 314 may be formed by spin coating or the like and may be exposed to light for patterning. In some embodiments, the photoresist 314 includes a bottom anti-reflective coating (BARC) or an absorptive layer, such that only the photoresist 314 is exposed to light, and the photosensitive encapsulant 306 is not exposed to light or developed. The patterning forms openings through the photoresist 314 to expose the mask layer 312.

Figure 10:
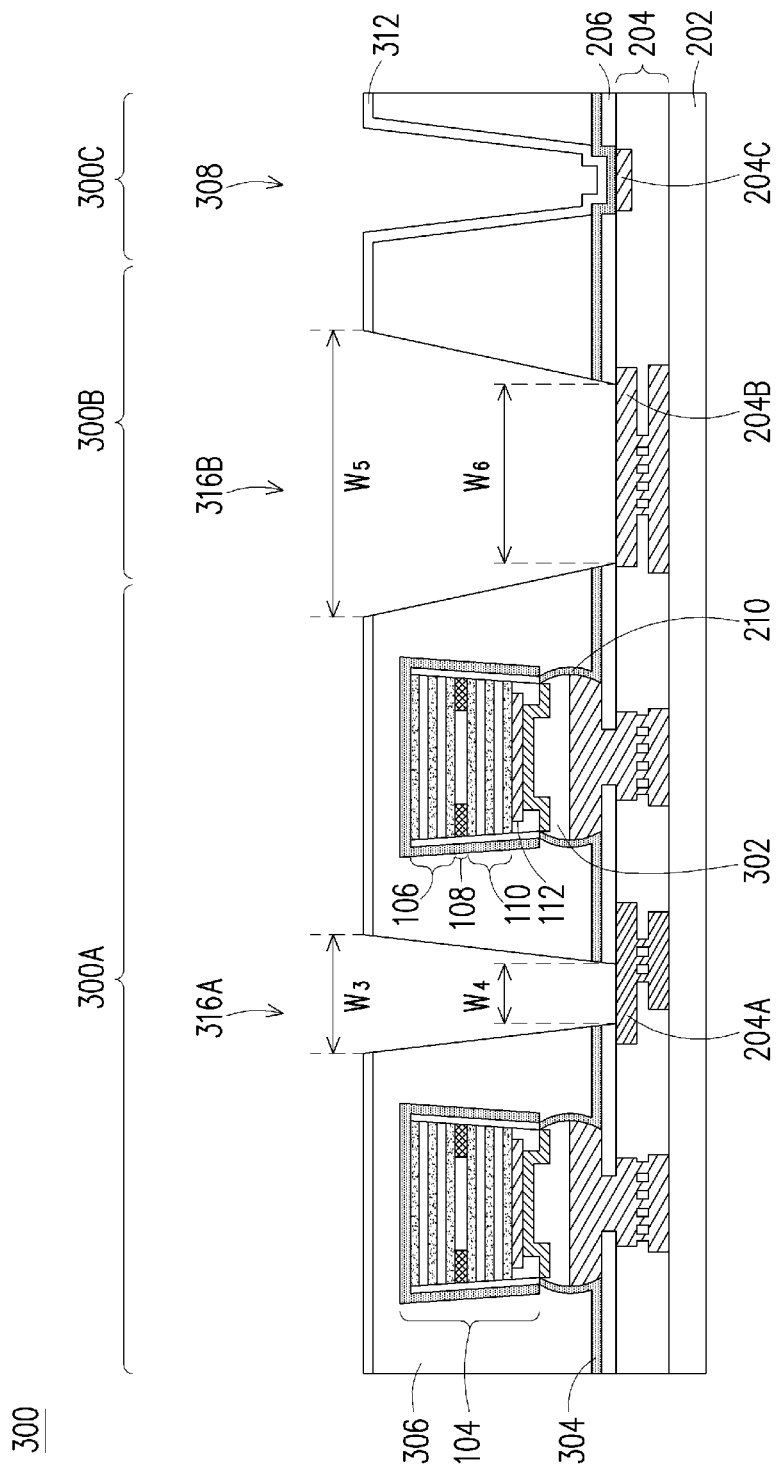

In FIG. 10, the photosensitive encapsulant 306 is patterned by transferring the pattern of the photoresist 314 to the mask layer 312, and then transferring the pattern of the mask layer 312 to the photosensitive encapsulant 306. The mask layer 312 may be patterned by an acceptable etching process, such as by wet etching, dry etching, or a combination thereof, using the patterned photoresist 314 as an etching mask. The photosensitive encapsulant 306 may then be patterned by an acceptable etching process, such as a dry etching using the patterned mask layer 312 as an etching mask. In some embodiments, the dry etch is a plasma etch, which may be performed with etchants such as $CF_4$ gas in $O_2$. The patterning forms openings 316A and 316B through the photosensitive encapsulant 306 to, respectively, expose the pads 204A and 204B of the interconnect structure 204. The openings 316A and 316B may have different sizes. The openings 316A have an upper width $W_3$ and a lower width $W_4$. In some embodiments, the upper width $W_3$ is in the range of from about 3 µm to about 5 µm (such as about 3 µm), and the lower width $W_4$ is in the range of from about 2 µm to about 4 µm. The openings 316B have an upper width $W_5$ and a lower width $W_6$. The upper width $W_5$ is greater than the upper width $W_3$, and the lower width $W_6$ is greater than the lower width $W_4$. In some embodiments, the upper width $W_5$ is in the range of from about 70 µm to about 90 µm, and the lower width $W_6$ is in the range of from about 50 µm to about 70 µm (such as about 50 µm). Once patterning of the photosensitive encapsulant 306 is complete, remaining portions of the mask layer 312 and photoresist 314 may be removed by, e.g., an etching process, an ashing process, combinations thereof, or the like.

Although the photosensitive encapsulant 306 is itself photosensitive, it is nonetheless patterned with a photolithography and etching process using the photoresist 314 and mask layer 312. Forming the openings 316A and 316B with the photolithography and etching process may allow the openings 316A and 316B to be smaller and have a finer pitch than openings formed by patterning the photosensitive encapsulant 306 through light exposure and development, such as the openings 308.

Figure 11:
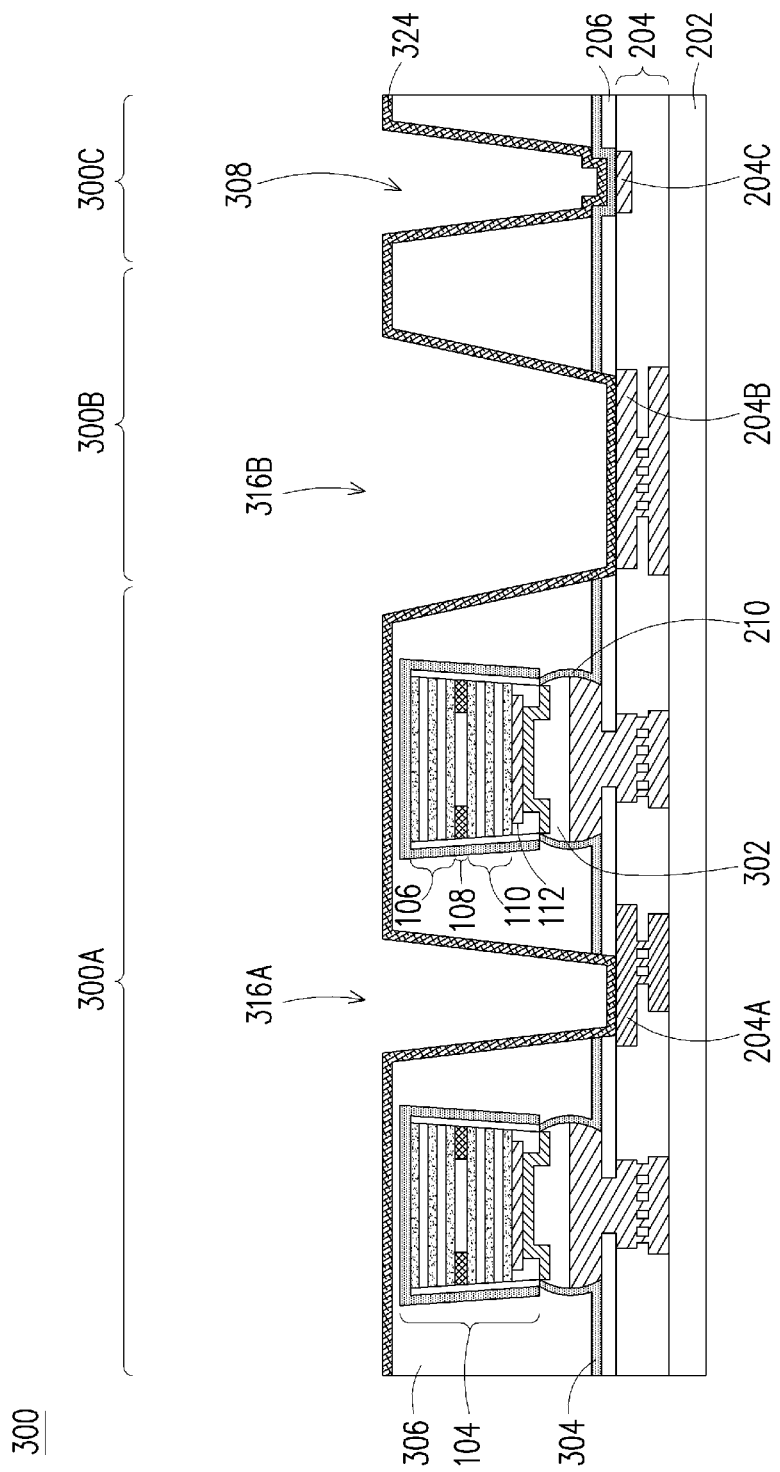

In FIG. 11, a seed layer 324 is formed over the photosensitive encapsulant 306 and in the openings 308, 316A, and 316B. In some embodiments, the seed layer 324 is a metal layer, which may be a single layer or a composite layer including a plurality of sub-layers formed of different materials. In some embodiments, the seed layer 324 comprises a titanium layer and a copper layer over the titanium layer. The seed layer 324 may be formed using, for example, PVD or the like.

Figure 12:
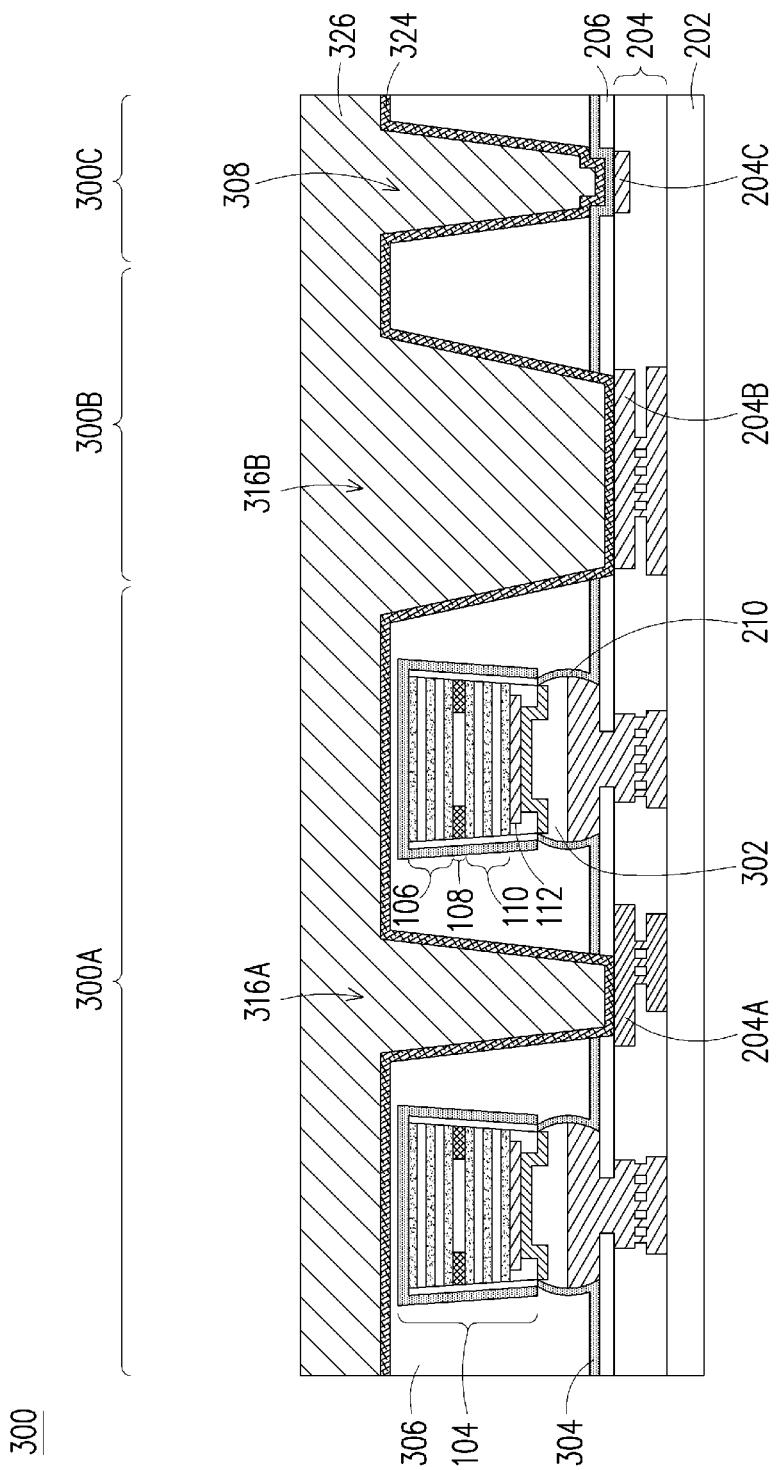

In FIG. 12, a conductive material 326 is formed on the seed layer 324 and in the openings 308, 316A, and 316B. The conductive material 326 may comprise a metal such as copper, titanium, tungsten, aluminum, or the like. The conductive material 326 may be formed by plating, such as electroplating or electroless plating, or the like.

Figure 13:
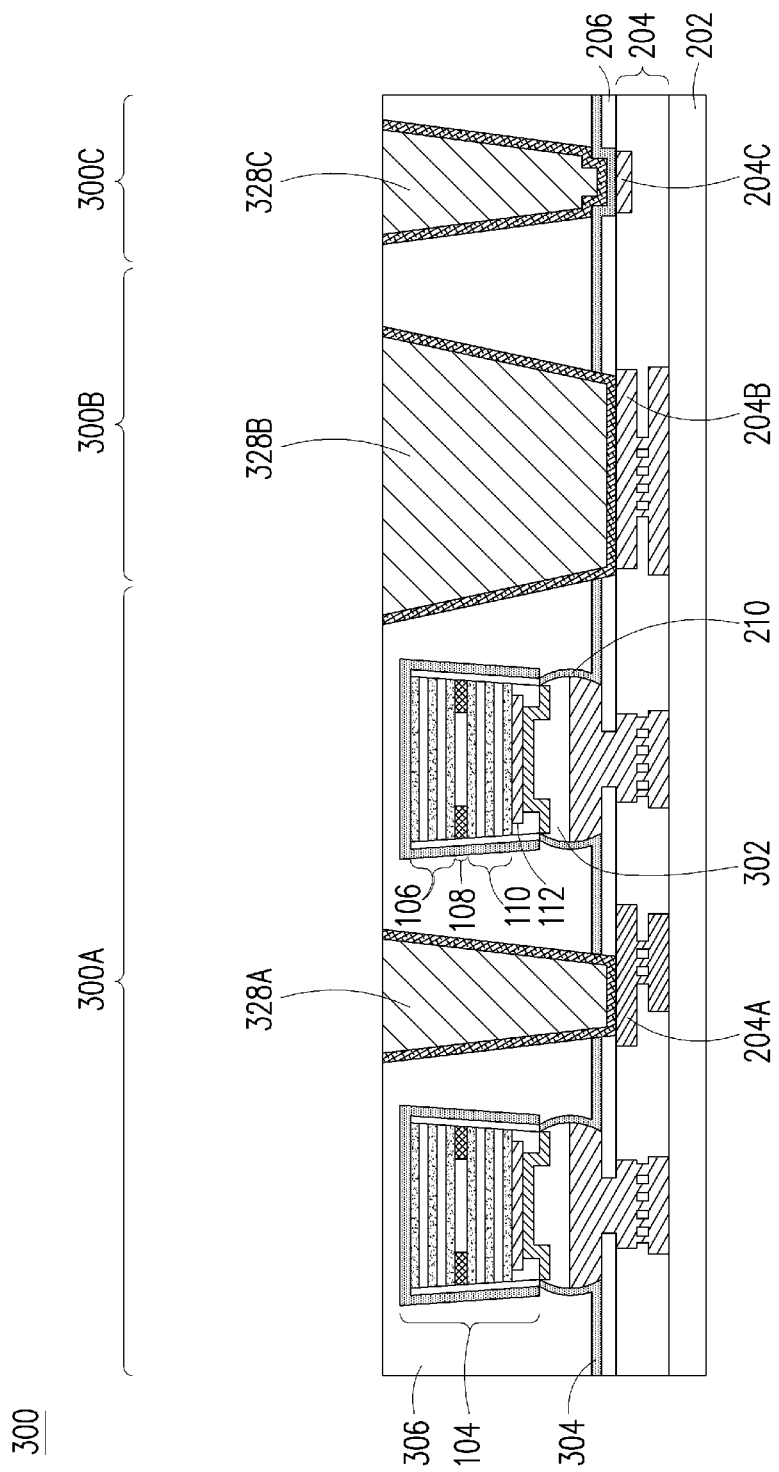

In FIG. 13, a planarization process is performed to planarize the conductive material 326 and photosensitive encapsulant 306. The planarization process may be, e.g., a grinding process, a CMP process, or the like. Remaining portions of the conductive material 326 and seed layer 324 form conductive vias 328A, 328B, and 328C in, respectively, the openings 308, 316A, and 316B. The conductive vias 328A, 328B are, respectively, physically and electrically connected to the pads 204A and 204B. Optionally, the conductive vias 328C may be connected to the alignment marks 204C. In embodiments where the alignment marks 204C are not exposed by the openings 308, the conductive vias 328C may be electrically isolated non-functional vias that are used for process alignment.

Figure 14:
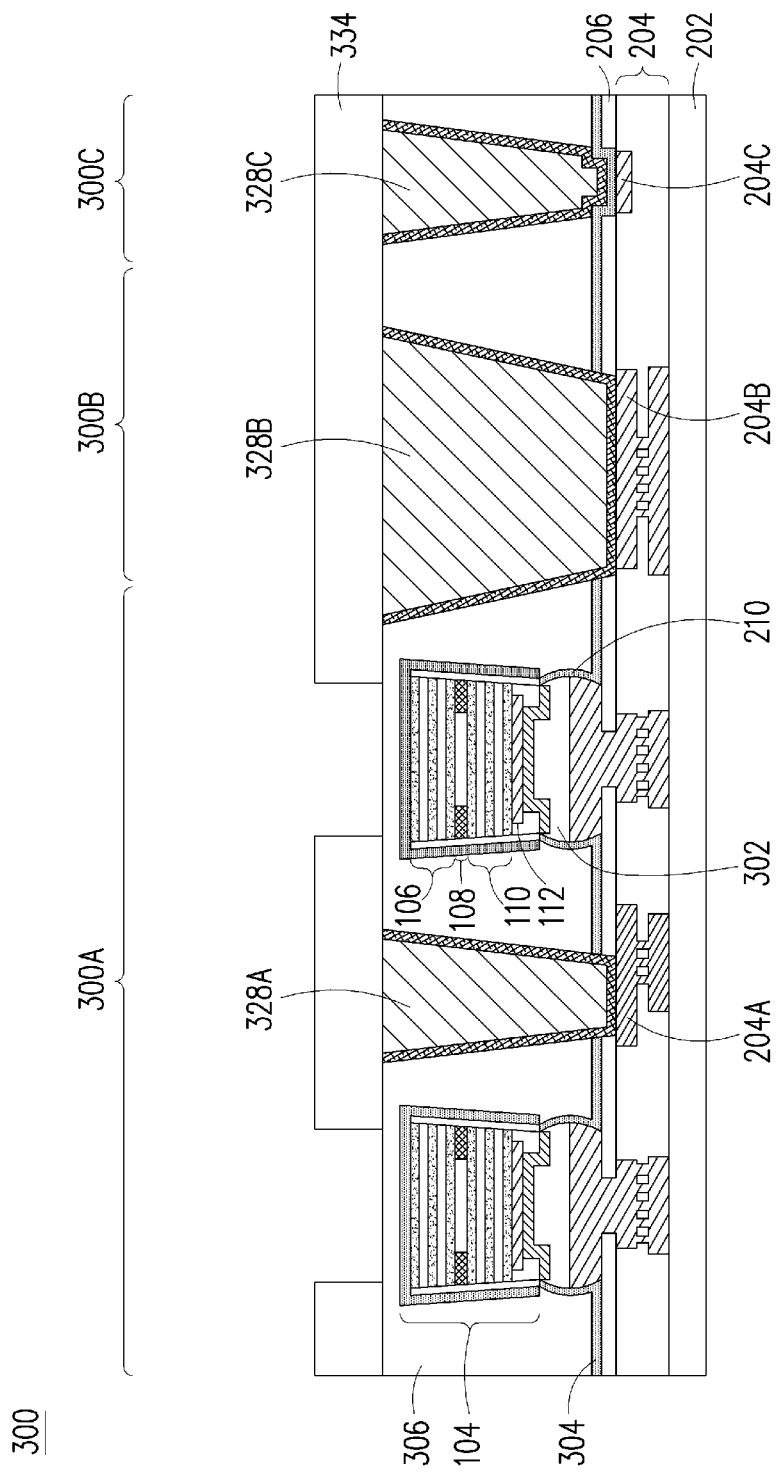

In FIG. 14, a photoresist 334 is formed on the photosensitive encapsulant 306 and the conductive vias 328A, 328B, and 328C. The photoresist 334 may be a single-layer photoresist, a tri-layer photoresist, or the like, may be formed by spin coating or the like, and may be exposed to light for patterning. In some embodiments, the photoresist 334 includes a bottom anti-reflective coating (BARC) or an absorptive layer, such that only the photoresist 334 is exposed to light, and the photosensitive encapsulant 306 is not exposed to light or developed. The patterning forms openings through the photoresist 334 to expose portions of the photosensitive encapsulant 306.

Figure 15:
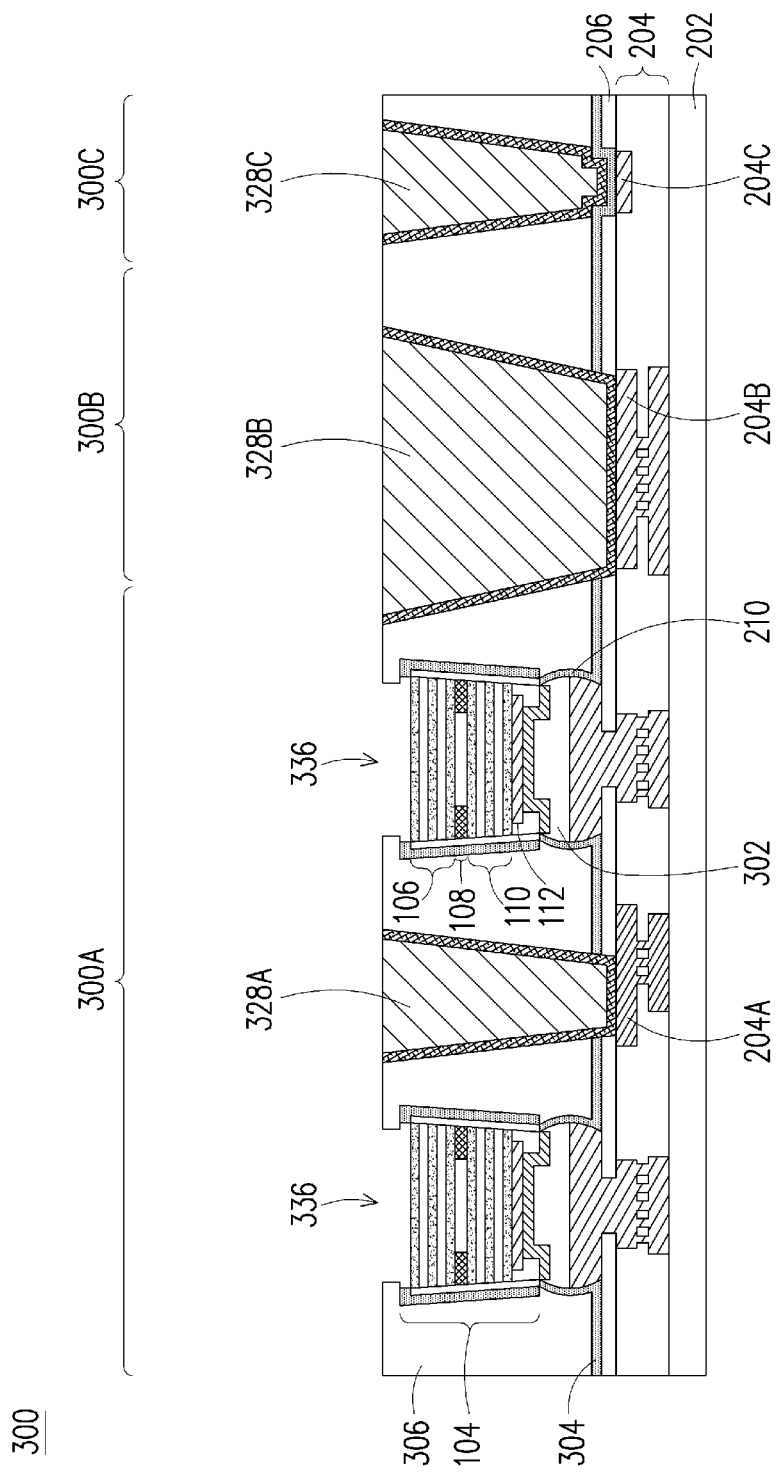

In FIG. 15, the passivation layer 304 is patterned by transferring the pattern of the photoresist 334 to the photosensitive encapsulant 306, and then transferring the pattern of the photosensitive encapsulant 306 to the passivation layer 304. The photosensitive encapsulant 306 may be patterned by an acceptable etching process, such as a dry etching using the photoresist 334 as an etching mask. In some embodiments, the dry etch is a plasma oxide etch. The passivation layer 304 may then be patterned by an acceptable etching process, such as a wet etching using the photosensitive encapsulant 306 as an etching mask. The patterning forms openings 336 through the passivation layer 304 to expose the first reflective structures 106 of the light emitting diodes 104. The photoresist 334 may be removed by an acceptable ashing or stripping process, such as using an oxygen plasma or the like. Forming the openings 336 with a photolithography and etching process may allow the openings 336 to be smaller and have a finer pitch than openings formed by patterning the photosensitive encapsulant 306 through light exposure and development, such as the openings 308.

Figure 16:
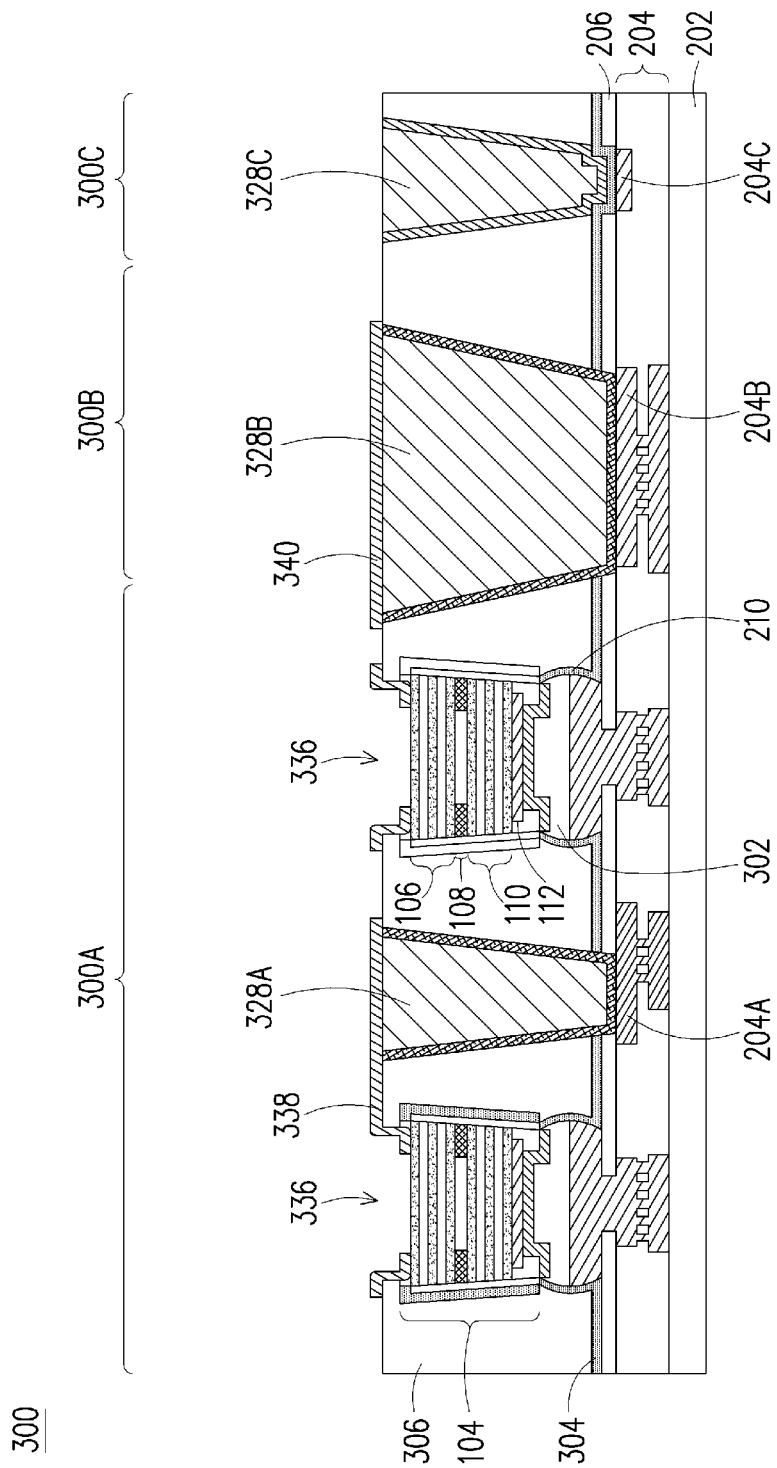

In FIG. 16, conductive lines 338 are formed in the openings 336, thereby forming contacts for the first reflective structures 106 of the light emitting diodes 104. A seed layer is formed over the photosensitive encapsulant 306 and in the openings 336. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive lines 338. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines 338.

In addition to being contacts for the first reflective structures 106, the conductive lines 338 connect the light emitting diodes 104 to the conductive vias 328A. After formation, the interconnect structure 204 is electrically connected to the second reflective structures 110 through the conductive connectors 302, and the interconnect structure 204 is electrically connected to the first reflective structures 106 through the conductive lines 338 and conductive vias 328A.

Further, test pads 340 are formed on the conductive vias 328B. The test pads 340 may be used for subsequent testing of the laser device 300. In some embodiments, testing may be performed at an intermediate stage of the process for manufacturing the laser device 300, and only known good devices (KGDs) may be used for further processing. The test pads 340 are electrically connected to the interconnect structure 204 through the conductive vias 328B.

Figure 17:
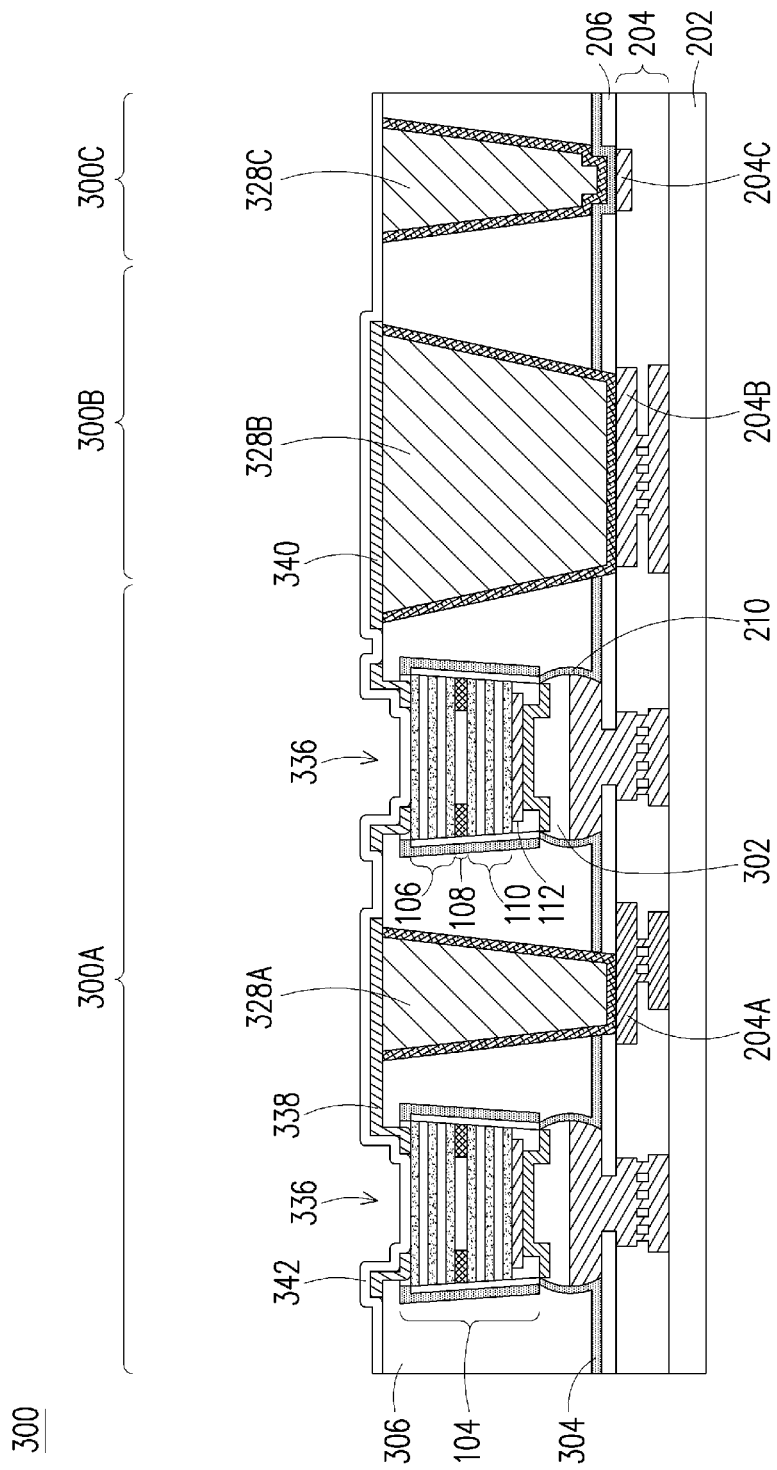

In FIG. 17, a passivation layer 342 is formed over the conductive lines 338, test pads 340, and photosensitive encapsulant 306. The passivation layer 342 may comprise silicon oxide, silicon nitride, or the like, and may be formed by a deposition process such as CVD. In some embodiments, the passivation layer 342 is formed from a nitride (such as silicon nitride).

Figure 18:
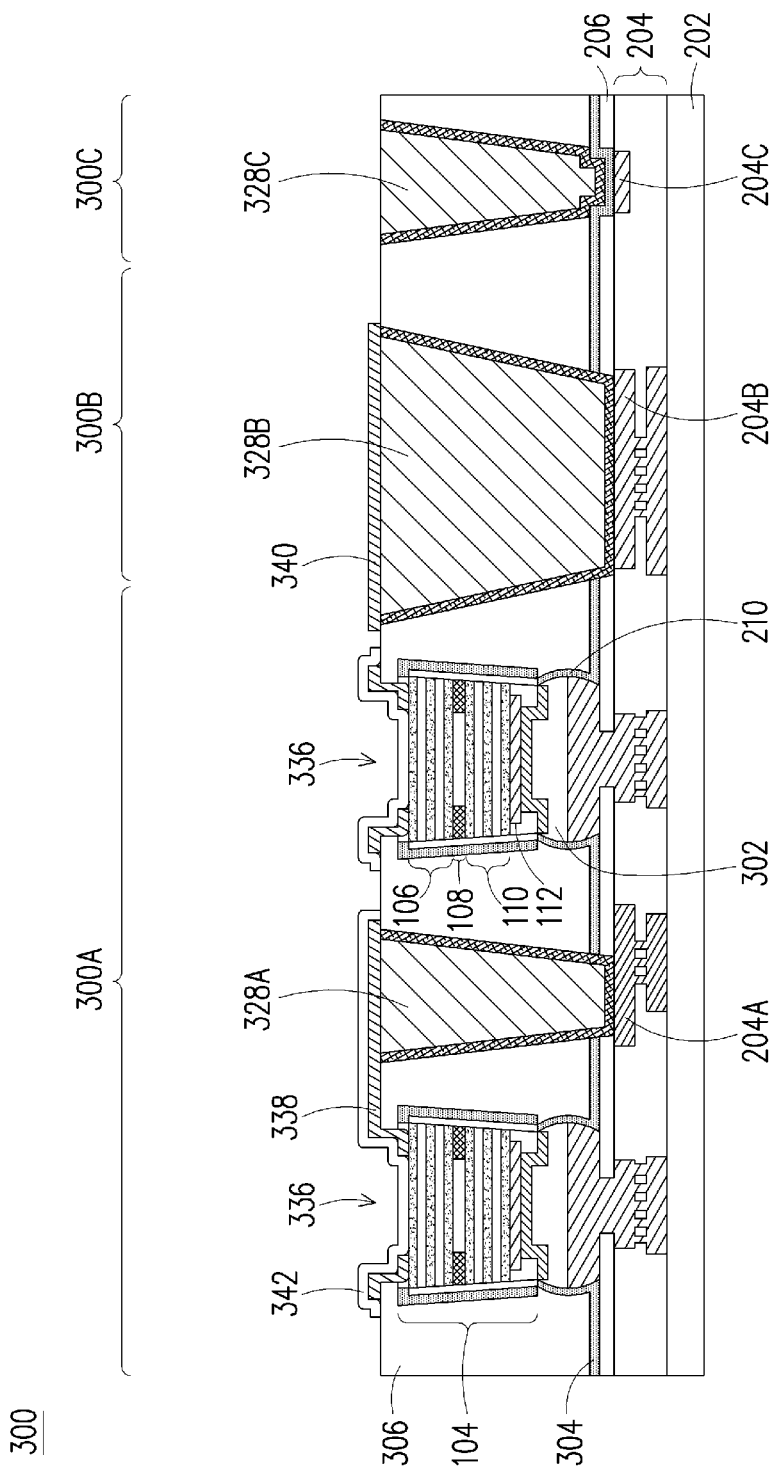

In FIG. 18, the passivation layer 342 is patterned, with remaining portions of the passivation layer 342 covering the conductive lines 338. The conductive vias 328B and 328C may thus be exposed. External connections may be formed to the conductive vias 328B. The test pads 340 may (or may not) be removed before the external connections are formed. For example, the test pads 340 may be removed after device testing and before the external connections are formed. In some embodiments, the external connections to the conductive vias 328B are wire bond connections. In some embodiments, external connections are not formed to the conductive vias 328C, and the conductive vias 328C remain electrically isolated in the final laser device 300.

Figure 19:
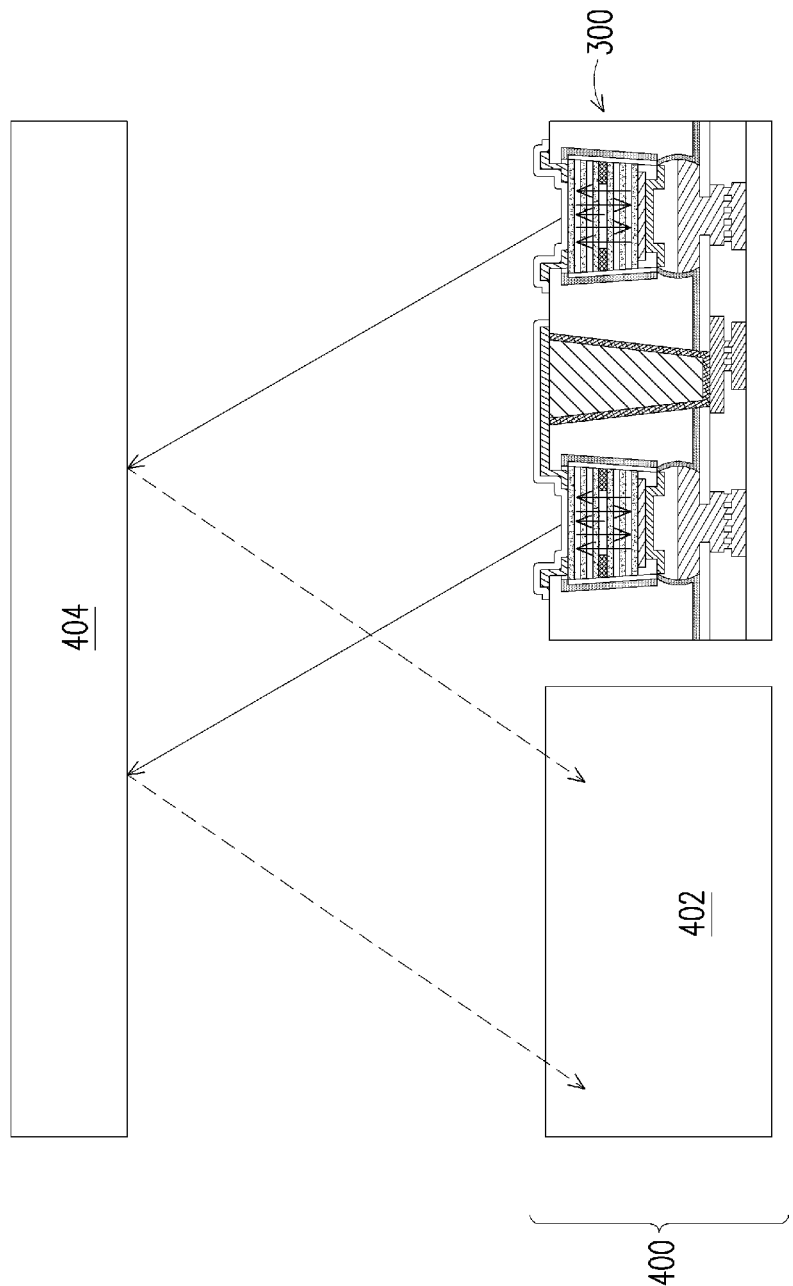
FIG. 19 illustrates operation of a laser device, in accordance with some embodiments.

FIG. 19 illustrates operation of the laser device 300, in accordance with some embodiments. The laser device 300 may be used as a laser beam source for a depth sensor 400. Laser beam(s) may be generated by the laser device 300 in pulses, and may be received by a detector 402 after being reflected by a target 404. A round trip time for the laser beam(s) may be measured and used to calculate the distance between the depth sensor 400 and the target 404. The detector 402 may be, e.g., a CMOS image sensor such as a photodiode. In some embodiments, the detector 402 is formed on a same substrate as the laser device 300. For example, the detector 402 may be formed in the semiconductor substrate 202 of the second structure 200 (see FIG. 4).

Figure 20:
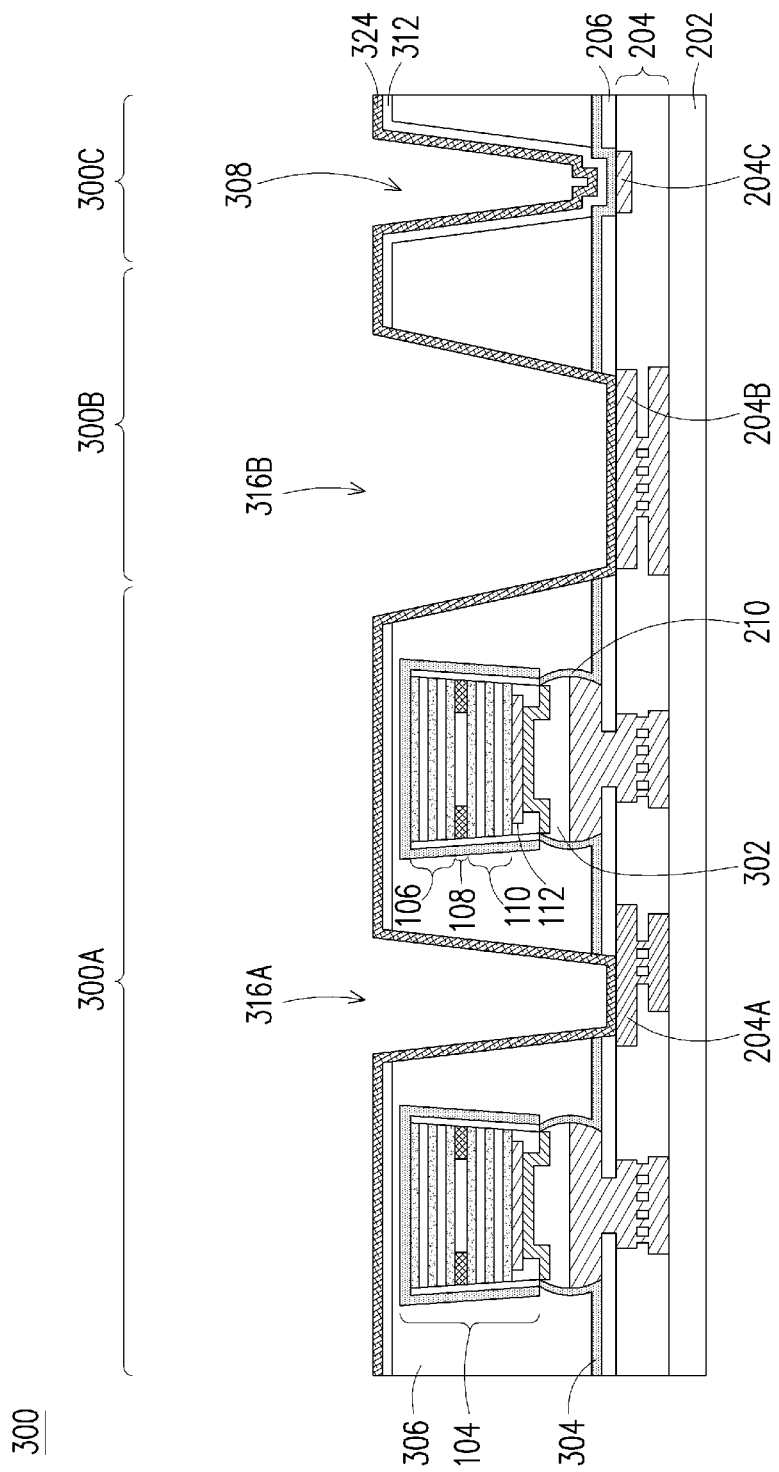
FIGS. 20 through 22 illustrate various cross-sectional view of a process for forming a laser device, in accordance with some other embodiments.
Figure 21:
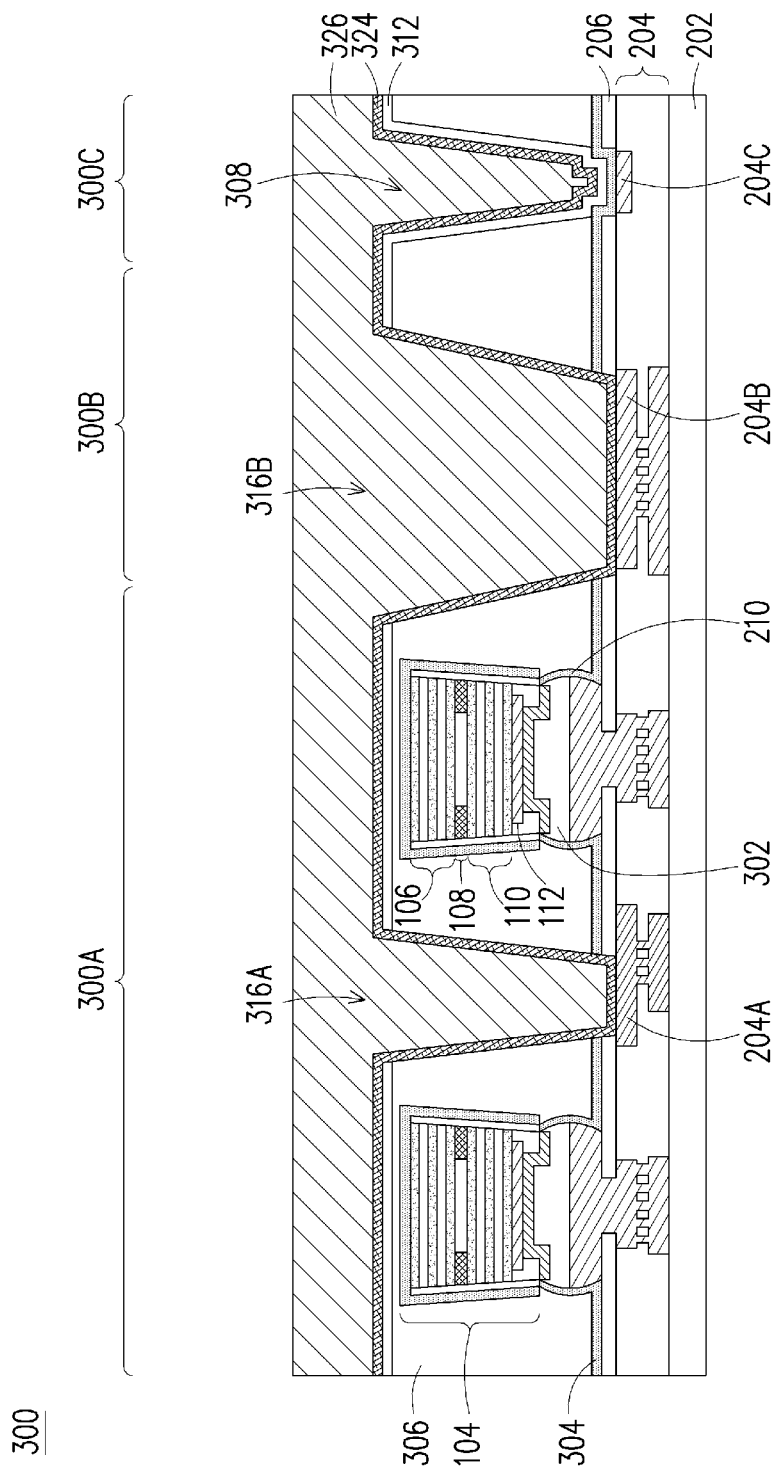
Figure 22:
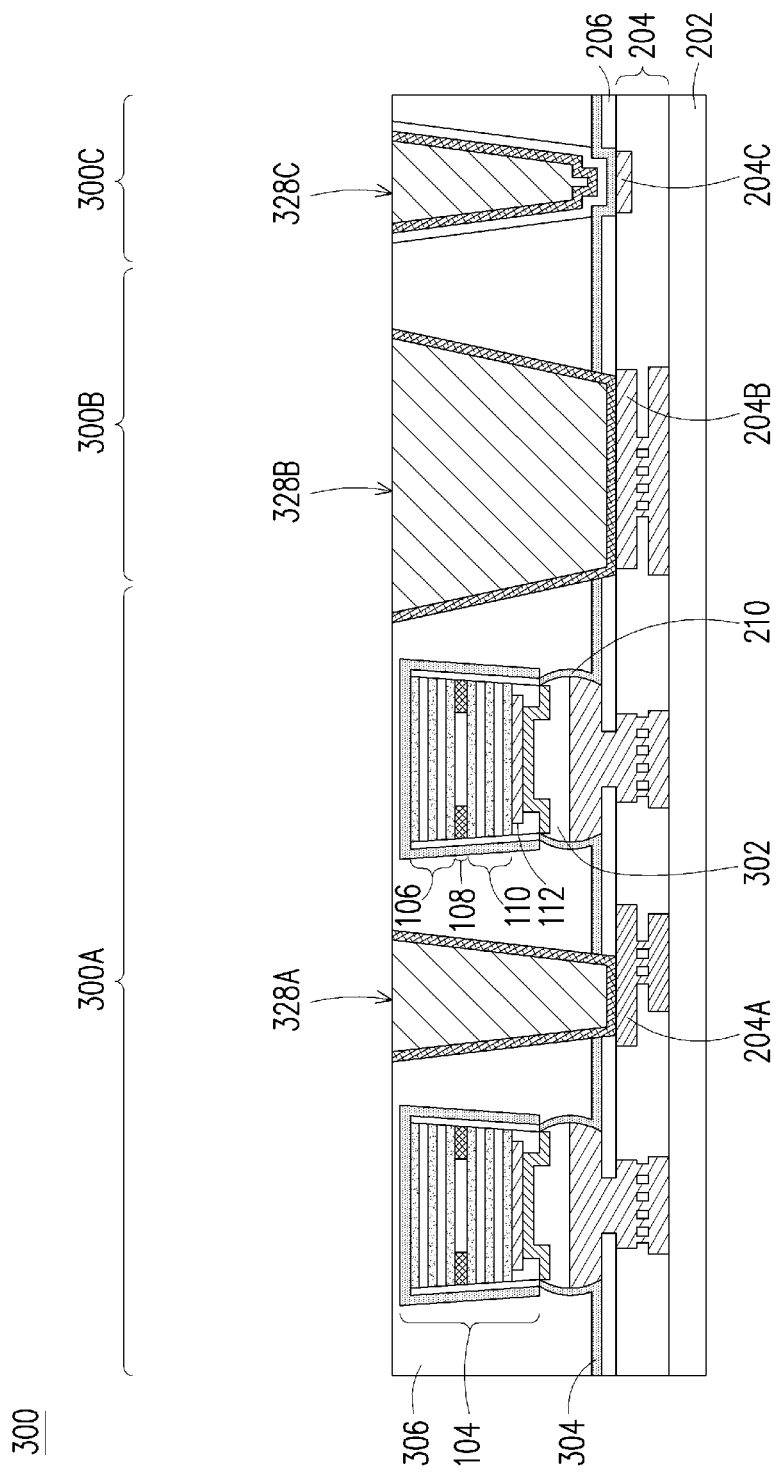

FIGS. 20 through 22 illustrate various cross-sectional view of a process for forming the first structure 100, in accordance with some other embodiments. In this embodiment, the mask layer 312 is not removed with the photoresist 314, but rather is removed after formation of the conductive material 326. In FIG. 20, the seed layer 324 is formed directly over the mask layer 312 and in the openings 308, 316A, and 316B. In FIG. 21, the conductive material 326 is formed on the seed layer 324 and in the openings 308, 316A, and 316B. In FIG. 22, a planarization process is performed to planarize the conductive material 326 and photosensitive encapsulant 306. Portions of the seed layer 324 and mask layer 312 overlying the photosensitive encapsulant 306 are removed by the planarization process. The resulting conductive vias 328C are electrically isolated by the mask layer 312.

Embodiments may achieve advantages. By forming the conductive vias 328A, 328B, and 328C after the light emitting diodes 104 are attached, the chances of collapsed conductive vias may be reduced. Further, by forming the openings 316A in the photosensitive encapsulant 306 by photolithography and etching instead of light exposure and development, the conductive vias 328A may be formed to a finer pitch with a higher aspect ratio, which may be important when the conductive vias 328A are formed among the light emitting diodes 104. In particular, the conductive vias 328A may have an aspect ratio as high as 4.2.

In an embodiment, a method includes: connecting a light emitting diode to a substrate; encapsulating the light emitting diode with a photosensitive encapsulant; forming a first opening through the photosensitive encapsulant adjacent the light emitting diode; and forming a conductive via in the first opening. In some embodiments of the method, forming the conductive via in the first opening includes: forming a mask layer on the photosensitive encapsulant; forming a photoresist on the mask layer; patterning the photoresist with a first pattern corresponding to the first opening; transferring the first pattern from the photoresist to the mask layer with a first etching process; and transferring the first pattern from the mask layer to the photosensitive encapsulant with a second etching process. In some embodiments of the method, the first etching process is a wet etch. In some embodiments of the method, the second etching process is a plasma oxide etch. In some embodiments of the method, the mask layer includes Ti, Cu, TiW, TaN, TiN, or a combination thereof. In some embodiments of the method, the light emitting diode includes: a first reflective structure including first doped layers of a semiconductive material, alternating ones of the first doped layers being doped with a p-type dopant; a second reflective structure including second doped layers of the semiconductive material, alternating ones of the second doped layers being doped with an n-type dopant; and an emitting semiconductor region disposed between the first reflective structure and the second reflective structure. In some embodiments, the method further includes: forming a second opening in the photosensitive encapsulant, the second opening exposing the light emitting diode; and plating a conductive line in the second opening, the conductive line connecting the first reflective structure of the light emitting diode and the conductive via. In some embodiments of the method, the light emitting diode further includes a contact pad on the second reflective structure, and connecting the light emitting diode to the substrate includes: connecting the contact pad of the light emitting diode to the substrate.

In an embodiment, a method includes: connecting a first structure to an interconnect, the first structure including a light emitting diode extending from a carrier substrate, a first terminal of the light emitting diode being connected to the interconnect; removing the carrier substrate to expose the light emitting diode; encapsulating the light emitting diode with a photosensitive encapsulant; after encapsulating the light emitting diode, forming a first conductive via extending through the photosensitive encapsulant to contact the interconnect; and forming a conductive line connecting a second terminal of the light emitting diode to the first conductive via.

In some embodiments of the method, the carrier substrate includes a semiconductive material, and the method further includes: forming a first reflective structure on the carrier substrate, the first reflective structure including first doped layers of the semiconductive material, alternating ones of the first doped layers being doped with a p-type dopant; forming an emitting semiconductor region on the first reflective structure; forming a second reflective structure on the emitting semiconductor region, the second reflective structure including second doped layers of the semiconductive material, alternating ones of the second doped layers being doped with an n-type dopant; and patterning the first reflective structure, the second reflective structure, and the emitting semiconductor region to form the light emitting diode. In some embodiments, the method further includes: forming a contact pad on the second reflective structure; depositing a passivation layer over the contact pad and the second reflective structure; forming an opening in the passivation layer exposing the contact pad; and forming an underbump metallurgy (UBM) in the opening to couple the contact pad. In some embodiments of the method, connecting the first structure to the interconnect includes: forming a conductive connector electrically connecting the UBM to the interconnect, the photosensitive encapsulant further encapsulating the conductive connector. In some embodiments of the method, the light emitting diode is connected to a first region of the interconnect, the interconnect includes an alignment mark in a second region, and the method further includes: forming a second conductive via extending through the photosensitive encapsulant to contact the interconnect. In some embodiments of the method, forming the first conductive via includes: forming a mask layer over the photosensitive encapsulant; patterning the mask layer to form a patterned mask; transferring the pattern of the patterned mask to the photosensitive encapsulant to form a first opening in the photosensitive encapsulant over the first region of the interconnect; and plating the first conductive via in the first opening. In some embodiments of the method, forming the second conductive via includes: exposing portions of the photosensitive encapsulant to light; and developing the exposed portions of the photosensitive encapsulant to form a second opening in the photosensitive encapsulant over the second region of the interconnect; and plating the second conductive via in the second opening.

In an embodiment, a device includes: an interconnect; a light emitting diode connected to the interconnect; a photosensitive encapsulant surrounding the light emitting diode; a first conductive via extending through the photosensitive encapsulant, the first conductive via being electrically connected to the interconnect, the first conductive via including a conductive material on a seed layer, the seed layer being disposed between the conductive material and the interconnect, the seed layer further being disposed between the conductive material and the photosensitive encapsulant; and a conductive line connecting the light emitting diode to the first conductive via.

In some embodiments of the device, the light emitting diode includes: a first reflective structure including first doped layers of a semiconductive material, alternating ones of the first doped layers being doped with a p-type dopant; a second reflective structure including second doped layers of the semiconductive material, alternating ones of the second doped layers being doped with an n-type dopant; and an emitting semiconductor region disposed between the first reflective structure and the second reflective structure. In some embodiments of the device, the light emitting diode further includes a contact pad on the second reflective structure, and the interconnect further includes a contact pad. In some embodiments of the device, the light emitting diode further includes an underbump metallurgy (UBM) on the contact pad. In some embodiments, the device further includes: a conductive connector connecting the UBM of the light emitting diode to the contact pad of the interconnect, the photosensitive encapsulant surrounding the conductive connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an interconnect structure comprising an alignment mark;
   a diode comprising a cathode and an anode, the cathode connected to the interconnect structure;
   an encapsulant encapsulating the diode;
   a first conductive via extending through the encapsulant, the first conductive via connected to the interconnect structure, the first conductive via contacting the encapsulant;
   a second conductive via extending through the encapsulant, the first conductive via and the second conductive via comprising a same orientation of material layers, the alignment mark disposed under the second conductive via; and
   a metal-containing layer between the second conductive via and each of the encapsulant and the alignment mark.

2. The device of claim 1 further comprising:
   a conductive line connecting the first conductive via to the anode of the diode.

3. The device of claim 2 further comprising:
   a passivation layer on the conductive line and the anode of the diode.

4. The device of claim 1, wherein the first conductive via comprises a first metal layer contacting a first sidewall of the encapsulant, and the second conductive via comprises a second metal layer contacting a second sidewall of the metal-containing layer.

5. The device of claim 4, wherein the first metal layer and the second metal layer comprise a first metal, and the metal-containing layer comprises a second metal, the second metal different from the first metal.

6. The device of claim 1, wherein the diode is a light emitting diode.

7. The device of claim 1, wherein the interconnect structure further comprises:
   a first contact pad connected to the cathode of the diode; and
   a second contact pad connected to the first conductive via.

8. The device of claim 7 further comprising:
   a conductive connector connecting the cathode of the diode to the first contact pad of the interconnect structure, the encapsulant encapsulating the conductive connector.

9. The device of claim 1 further comprising:
   a third conductive via extending through the encapsulant, the third conductive via connected to the interconnect structure, the third conductive via contacting the encapsulant; and
   a test pad on the third conductive via.

10. The device of claim 9 further comprising:
    a passivation layer on the test pad and the anode of the diode.

11. A device comprising:
    an interconnect structure comprising a first contact pad, a second contact pad, and an alignment mark;
    a light emitting diode comprising a cathode and an anode, the cathode connected to the first contact pad;
    an encapsulant encapsulating the light emitting diode;
    a first conductive via extending through the encapsulant, the first conductive via comprising a first seed layer, the first seed layer contacting the second contact pad;
    a second conductive via extending through the encapsulant, the second conductive via comprising a second seed layer, the first seed layer and the second seed layer comprising a first metal; and
    a hardmask layer between the second seed layer and the alignment mark, the hardmask layer comprising a second metal, the second metal different from the first metal.

12. The device of claim 11 further comprising:
    a conductive line on the encapsulant, the conductive line connecting the first conductive via to the anode of the light emitting diode.

13. The device of claim 12 further comprising:
    a passivation layer on the conductive line and the anode of the light emitting diode.

14. The device of claim 11, wherein the anode comprises a p-type semiconductive material, the cathode comprises an n-type semiconductive material, and the light emitting diode further comprises:
    an emitting semiconductor region between the anode and the cathode.

15. The device of claim 11 further comprising:
    a conductive connector connecting the cathode of the light emitting diode to the first contact pad of the interconnect structure, the encapsulant encapsulating the conductive connector; and
    a passivation layer on a sidewall of the conductive connector and a sidewall of the first contact pad.

16. A device comprising:
    an interconnect comprising a first contact pad, a second contact pad, and an alignment mark;
    a light emitting diode connected to the first contact pad of the interconnect;
    an encapsulant surrounding the light emitting diode;

a first conductive via extending through the encapsulant, the first conductive via electrically connected to the second contact pad of the interconnect, the first conductive via comprising a first conductive material and a first seed layer, the first seed layer contacting the second contact pad of interconnect, the first conductive material contacting the first seed layer, the first seed layer disposed between the first conductive material and the interconnect, the first seed layer further disposed between the first conductive material and the encapsulant;

a second conductive via extending through the encapsulant, the second conductive via comprising a second conductive material, a second seed layer, and a mask layer, the second seed layer contacting the mask layer, the second conductive material contacting the second seed layer, the mask layer disposed between the second conductive material and the alignment mark; and a conductive line connecting the light emitting diode to the first conductive via.

17. The device of claim 16, wherein the light emitting diode comprises:

a first reflective structure comprising first doped layers of a semiconductive material, alternating ones of the first doped layers doped with a p-type dopant;

a second reflective structure comprising second doped layers of the semiconductive material, alternating ones of the second doped layers doped with an n-type dopant; and an emitting semiconductor region disposed between the first reflective structure and the second reflective structure.

18. The device of claim 17, wherein the light emitting diode further comprises a third contact pad on the second reflective structure.

19. The device of claim 18, wherein the light emitting diode further comprises an underbump metallurgy (UBM) on the third contact pad.

20. The device of claim 19 further comprising:

a conductive connector connecting the UBM of the light emitting diode to the first contact pad of the interconnect, the encapsulant surrounding the conductive connector.

* * * * *